US012803418B2

(12) United States Patent
Oh

(10) Patent No.: US 12,803,418 B2
(45) Date of Patent: Nov. 17, 2026

(54) MOTOR DRIVING DEVICE, AND VEHICLE HAVING SAME

(71) Applicant: LG MAGNA E-POWERTRAIN CO., LTD., Incheon (KR)

(72) Inventor: Youngsuk Oh, Incheon (KR)

(73) Assignee: LG MAGNA E-POWERTRAIN CO., LTD., Incheon (KR)

( * ) Notice: Subject to any disclaimer, the term of this patent is extended or adjusted under 35 U.S.C. 154(b) by 119 days.

(21) Appl. No.: 18/875,418

(22) PCT Filed: Jun. 17, 2022

(86) PCT No.: PCT/KR2022/008611
§ 371 (c)(1),
(2) Date: Dec. 16, 2024

(87) PCT Pub. No.: WO2023/243751
PCT Pub. Date: Dec. 21, 2023

(65) Prior Publication Data

US 2025/0357847 A1 Nov. 20, 2025

(51) Int. Cl.

| | |
|---|---|
| ***H02M 1/084*** | (2006.01) |
| ***B60L 50/51*** | (2019.01) |
| ***H02M 1/00*** | (2006.01) |
| ***H02M 7/5387*** | (2007.01) |
| ***H02P 21/20*** | (2016.01) |

(Continued)

(52) U.S. Cl.
CPC ........... *H02M 1/0845* (2013.01); *B60L 50/51* (2019.02); *H02M 1/0029* (2021.05); *H02M 1/0054* (2021.05); *H02M 7/53873* (2013.01); *H02P 21/20* (2016.02); *H02P 21/22* (2016.02);
(Continued)

(58) Field of Classification Search
CPC ............. H02M 1/0845; H02M 1/0029; H02M 1/0054; H02M 7/53873; H02M 7/5387; H02M 1/08; B60L 50/51; B60L 2210/42; H02P 21/20; H02P 21/22; H02P 27/08;
(Continued)

(56) References Cited

U.S. PATENT DOCUMENTS 8,558,491 B2 10/2013 Kuwabara et al.
8,829,976 B2 9/2014 Kuwabara et al.
(Continued)

FOREIGN PATENT DOCUMENTS

JP 2016-073127 A 5/2016
KR 10-1445960 B1 9/2014
KR 10-2021-0065502 A 6/2021

*Primary Examiner* — Kyle J Moody
(74) *Attorney, Agent, or Firm* — Birch, Stewart, Kolasch & Birch, LLP

(57) ABSTRACT

A motor driving device and a vehicle having the same are disclosed. The motor driving device according to an embodiment of the present disclosure includes: an inverter including a plurality of inverter switching elements; a gate driver configured to output gate control signal to gate terminal of the plurality of inverter switching elements, respectively; a first resistor and a second resistor arranged between the gate driver and a gate terminal of each inverter switching element; a resistance variable switching element connected to both ends of the second resistor; and a switch driver configured to output a switch control signal to the resistance variable switching element. Accordingly, it is possible to reduce the switching loss of the inverter.

18 Claims, 20 Drawing Sheets

(51) Int. Cl.
*H02P 21/22* (2016.01)
*H02P 27/08* (2006.01)
*H03K 17/16* (2006.01)

(52) U.S. Cl.
CPC ........... *H02P 27/08* (2013.01); *H03K 17/162* (2013.01); *B60L 2210/42* (2013.01)

(58) Field of Classification Search
CPC .................... H02P 6/08; H03K 17/162; H03K 2217/0036; B60K 1/00
See application file for complete search history.

(56) References Cited

U.S. PATENT DOCUMENTS

| | | | | |
|---|---|---|---|---|
| 2004/0218319 | A1* | 11/2004 | Sae-Ueng ............... | H02M 1/36<br>361/18 |
| 2012/0182051 | A1 | 7/2012 | Aoki et al. | |
| 2016/0079904 | A1 | 3/2016 | Krishnamurthy et al. | |
| 2016/0211767 | A1 | 7/2016 | Hotta | |
| 2017/0021733 | A1 | 1/2017 | Kondou et al. | |
| 2017/0274776 | A1* | 9/2017 | Xu .......................... | B60L 50/10 |

* cited by examiner

MOTOR DRIVING DEVICE, AND VEHICLE HAVING SAME

CROSS REFERENCE TO RELATED APPLICATIONS

This application is the National Phase of PCT International Application No. PCT/KR2022/008611, filed on Jun. 17, 2022, which is hereby expressly incorporated by reference into the present application.

BACKGROUND

1. Field

The present disclosure relates to a motor driving device and a vehicle having the same, and more particularly, to a motor driving device capable of reducing switching loss of an inverter, and a vehicle having the same.

2. Description of the Related Art

Electric vehicles that has electricity as power, or hybrid vehicles that combine internal combustion engines and these, generate outputs thereof using motors and batteries.

Meanwhile, to drive the motor, a motor driving device that drives the motor with AC power is required.

Meanwhile, the motor driving device is equipped with an inverter including a plurality of inverter switching elements, and a gate driving signal is input to the gate terminal of the inverter switching element to drive the inverter switching element.

Meanwhile, Korean Patent Unexamined Publication No. 2009-0014540 (hereinafter referred to as "prior document") discloses a gate driving circuit and a display device having the same.

According to the prior document, since the gate driving circuit controls a power switch using a single gate resistor, a rising slope of the inverter switching element becomes constant.

According to such a scheme, even if DC power input to the inverter varies, the rising slope of the inverter switching element remains constant. In particular, as a level of the DC power input to the inverter increases, switching loss increases proportionally.

SUMMARY

The present disclosure has been made in view of the above problems, and provides a motor driving device capable of reducing switching loss of an inverter, and a vehicle having the same.

The present disclosure further provides a motor driving device capable of changing a rising slope of an inverter switching element, and a vehicle having the same.

In accordance with an aspect of the present disclosure, a motor driving device, and a vehicle having the same include: an inverter including a plurality of inverter switching elements; a gate driver configured to output gate control signal to gate terminal of the plurality of inverter switching elements, respectively; a first resistor and a second resistor arranged between the gate driver and a gate terminal of each inverter switching element; a resistance variable switching element connected to both ends of the second resistor; and a switch driver configured to output a switch control signal to the resistance variable switching element.

Meanwhile, in response to the resistance variable switching element being turned off based on a first level of the switch control signal, the gate control signal may be input to the gate terminal through the first resistor and the second resistor, and in response to the resistance variable switching element being turned on based on a second level of the switch control signal, the gate control signal may be input to the gate terminal through the first resistor and the resistance variable switching element.

Meanwhile, the motor driving device, and the vehicle having the same may further include a controller configured to control the switch driver, and the controller may be configured to turn on the inverter switching element based on a first rising slope as the resistance variable switching element is turned off, and turn on the inverter switching element based on a second rising slope greater than the first rising slope as the resistance variable switching element is turned on.

Meanwhile, the controller may be configured to control a gate resistance of the inverter switching element to be a first resistance value as the resistance variable switching element is turned off, and control the gate resistance of the inverter switching element to be a second resistance value less than the first resistance value as the resistance variable switching element is turned on.

According to the aspect of the present disclosure, the motor driving device, and the vehicle having the same may further include a voltage detector configured to detect a voltage of a dc terminal corresponding to an input terminal of the inverter; and a controller configured to control the switch driver, and the controller may be configured to turn on the inverter switching element based on the first rising slope in response to a voltage level of the dc terminal being in a first voltage range, and turn on the inverter switching element based on the second rising slope greater than the first rising slope in response to the voltage level of the dc terminal being in a second voltage range less than the first voltage range.

Meanwhile, a resistance value of the second resistor may be greater than a resistance value of the first resistor Meanwhile, a gate-on resistance of the gate terminal may be greater than a gate-off resistance.

Meanwhile, a rising time when the gate terminal is turned on may be greater than a falling time when the gate terminal is turned off.

Meanwhile, the inverter may include three pairs of upper inverter switching elements and lower inverter switching elements connected to each other in series, and the switch driver may be configured to output a common switch control signal to a resistance variable switching element connected to each of three lower inverter switching elements.

In accordance with another aspect of the present disclosure, a motor driving device, and a vehicle having the same include: an inverter including a plurality of inverter switching elements; a gate driver configured to output gate control signal to gate terminal of the plurality of inverter switching elements, respectively; a voltage detector configured to detect a voltage of a dc terminal corresponding to an input terminal of the inverter; and a controller configured to control the inverter, and the controller is configured to change a rising slope of the inverter switching element based on a voltage level of the dc terminal.

Meanwhile, the controller may be configured to turn on the inverter switching element based on a first rising slope in response to the voltage level of the dc terminal being in a first voltage range, and turn on the inverter switching element based on a second rising slope greater than the first rising slope in response to the voltage level of the dc terminal being in a second voltage range less than the first voltage range.

Meanwhile, in accordance with another embodiment of the present disclosure, the motor driving device, and the vehicle having the same may further include a first resistor and a second resistor arranged between the gate driver and a gate terminal of each inverter switching element; a resistance variable switching element connected to both ends of the second resistor; and a switch driver configured to output a switch control signal to the resistance variable switching element.

Meanwhile, the controller may be configured to turn on the inverter switching element based on the first rising slope as the resistance variable switching element is turned off, and turn on the inverter switching element based on the second rising slope greater than the first rising slope as the resistance variable switching element is turned on.

Meanwhile, the controller may be configured to control a gate resistance of the inverter switching element to be a first resistance value as the resistance variable switching element is turned off, and control the gate resistance of the inverter switching element to be a second resistance value less than the first resistance value as the resistance variable switching element is turned on.

Meanwhile, the controller may be configured to turn on the inverter switching element based on the first rising slope when a vehicle velocity is equal to or more than a reference velocity, and turn on the inverter switching element based on the second rising slope greater than the first rising slope when the vehicle velocity is less than the reference velocity.

Meanwhile, the controller may be configured to turn on the inverter switching element based on the first rising slope in response to the vehicle being driven on a downhill road, and turn on the inverter switching element based on a second rising slope greater than the first rising slope in response to the vehicle being driven on an uphill road.

Effects of the Disclosure

In accordance with an aspect of the present disclosure, a motor driving device, and a vehicle having the same include: an inverter including a plurality of inverter switching elements; a gate driver configured to output gate control signal to gate terminal of the plurality of inverter switching elements, respectively; a first resistor and a second resistor arranged between the gate driver and a gate terminal of each inverter switching element; a resistance variable switching element connected to both ends of the second resistor; and a switch driver configured to output a switch control signal to the resistance variable switching element. Accordingly, it is possible to reduce the switching loss of the inverter. In particular, by changing the gate resistance through the operation of the resistance variable switching element, it is possible to reduce the switching loss of the inverter.

Meanwhile, in response to the resistance variable switching element being turned off based on a first level of the switch control signal, the gate control signal may be input to the gate terminal through the first resistor and the second resistor, and in response to the resistance variable switching element being turned on based on a second level of the switch control signal, the gate control signal may be input to the gate terminal through the first resistor and the resistance variable switching element. Accordingly, it is possible to change the rising slope of the upper inverter switching element, and reduce the switching loss of the inverter.

Meanwhile, the motor driving device, and the vehicle having the same may further include a controller configured to control the switch driver, and the controller may be configured to turn on the inverter switching element based on a first rising slope as the resistance variable switching element is turned off, and turn on the inverter switching element based on a second rising slope greater than the first rising slope as the resistance variable switching element is turned on. Accordingly, it is possible to change the rising slope of the upper inverter switching element, and reduce the switching loss of the inverter.

Meanwhile, the controller may be configured to control a gate resistance of the inverter switching element to be a first resistance value as the resistance variable switching element is turned off, and control the gate resistance of the inverter switching element to be a second resistance value less than the first resistance value as the resistance variable switching element is turned on. Accordingly, it is possible to change the rising slope of the upper inverter switching element, and reduce the switching loss of the inverter.

According to the aspect of the present disclosure, the motor driving device, and a vehicle having the same may further include a voltage detector configured to detect a voltage of a dc terminal corresponding to an input terminal of the inverter; and a controller configured to control the switch driver, and the controller may be configured to turn on the inverter switching element based on the first rising slope in response to a voltage level of the dc terminal being in a first voltage range, and turn on the inverter switching element based on the second rising slope greater than the first rising slope in response to the voltage level of the dc terminal being in a second voltage range less than the first voltage range. Accordingly, it is possible to change the rising slope of the upper inverter switching element, and reduce the switching loss of the inverter.

Meanwhile, a resistance value of the second resistor may be greater than a resistance value of the first resistor. Accordingly, it is possible to change the rising slope of the upper inverter switching element, and reduce the switching loss of the inverter.

Meanwhile, a gate-on resistance of the gate terminal may be greater than a gate-off resistance. Accordingly, it is possible to reduce the switching loss by differentiating the rising and falling slopes.

Meanwhile, a rising time when the gate terminal is turned on may be greater than a falling time when the gate terminal is turned off. Accordingly, it is possible to reduce the switching loss by differentiating the rising and falling slopes.

Meanwhile, the inverter may include three pairs of upper inverter switching elements and lower inverter switching elements connected to each other in series, and the switch driver may be configured to output a common switch control signal to a resistance variable switching element connected to each of three lower inverter switching elements. Accordingly, the common switching control signal is output to efficiently drive the plurality of resistance variable switching elements.

In accordance with another aspect of the present disclosure, a motor driving device, and a vehicle having the same include: an inverter including a plurality of inverter switching elements; a gate driver configured to output gate control signal to gate terminal of the plurality of inverter switching elements, respectively; a voltage detector configured to detect a voltage of a dc terminal corresponding to an input terminal of the inverter; and a controller configured to control the inverter, and the controller is configured to change a rising slope of the inverter switching element based on a voltage level of the dc terminal. Accordingly, it is possible to reduce the switching loss of the inverter.

Meanwhile, the controller may be configured to turn on the inverter switching element based on a first rising slope in response to the voltage level of the dc terminal being in a first voltage range, and turn on the inverter switching element based on a second rising slope greater than the first rising slope in response to the voltage level of the dc terminal being in a second voltage range less than the first voltage range. Accordingly, it is possible to change the rising slope of the upper inverter switching element, and reduce the switching loss of the inverter.

Meanwhile, in accordance with another embodiment of the present disclosure, the motor driving device, and the vehicle having the same may further include a first resistor and a second resistor arranged between the gate driver and a gate terminal of each inverter switching element; a resistance variable switching element connected to both ends of the second resistor; and a switch driver configured to output a switch control signal to the resistance variable switching element. Accordingly, it is possible to change the rising slope of the upper inverter switching element, and reduce the switching loss of the inverter.

Meanwhile, the controller may be configured to turn on the inverter switching element based on the first rising slope as the resistance variable switching element is turned off, and turn on the inverter switching element based on the second rising slope greater than the first rising slope as the resistance variable switching element is turned on. Accordingly, it is possible to change the rising slope of the upper inverter switching element, and reduce the switching loss of the inverter.

Meanwhile, the controller may be configured to control a gate resistance of the inverter switching element to be a first resistance value as the resistance variable switching element is turned off, and control the gate resistance of the inverter switching element to be a second resistance value less than the first resistance value as the resistance variable switching element is turned on. Accordingly, it is possible to change the rising slope of the upper inverter switching element, and reduce the switching loss of the inverter.

Meanwhile, the controller may be configured to turn on the inverter switching element based on the first rising slope when a vehicle velocity is equal to or more than a reference velocity, and turn on the inverter switching element based on the second rising slope greater than the first rising slope when the vehicle velocity is less than the reference velocity. Accordingly, it is possible to change the rising slope of the upper inverter switching element based on the vehicle velocity, and reduce the switching loss of the inverter.

Meanwhile, the controller may be configured to turn on the inverter switching element based on the first rising slope in response to the vehicle being driven on a downhill road, and turn on the inverter switching element based on a second rising slope greater than the first rising slope in response to the vehicle being driven on an uphill road. Accordingly, it is possible to change the rising slope of the upper inverter switching element based on a driving path of the vehicle, and reduce the switching loss of the inverter.

DETAILED DESCRIPTION OF THE PREFERRED EMBODIMENTS

Reference will now be made in detail to the preferred embodiments of the present disclosure, examples of which are illustrated in the accompanying drawings.

The suffixes "module" and "unit" in elements used in description below are given only in consideration of ease in preparation of the specification and do not have specific meanings or functions. Therefore, the suffixes "module" and "unit" may be used interchangeably.

Figure 1:
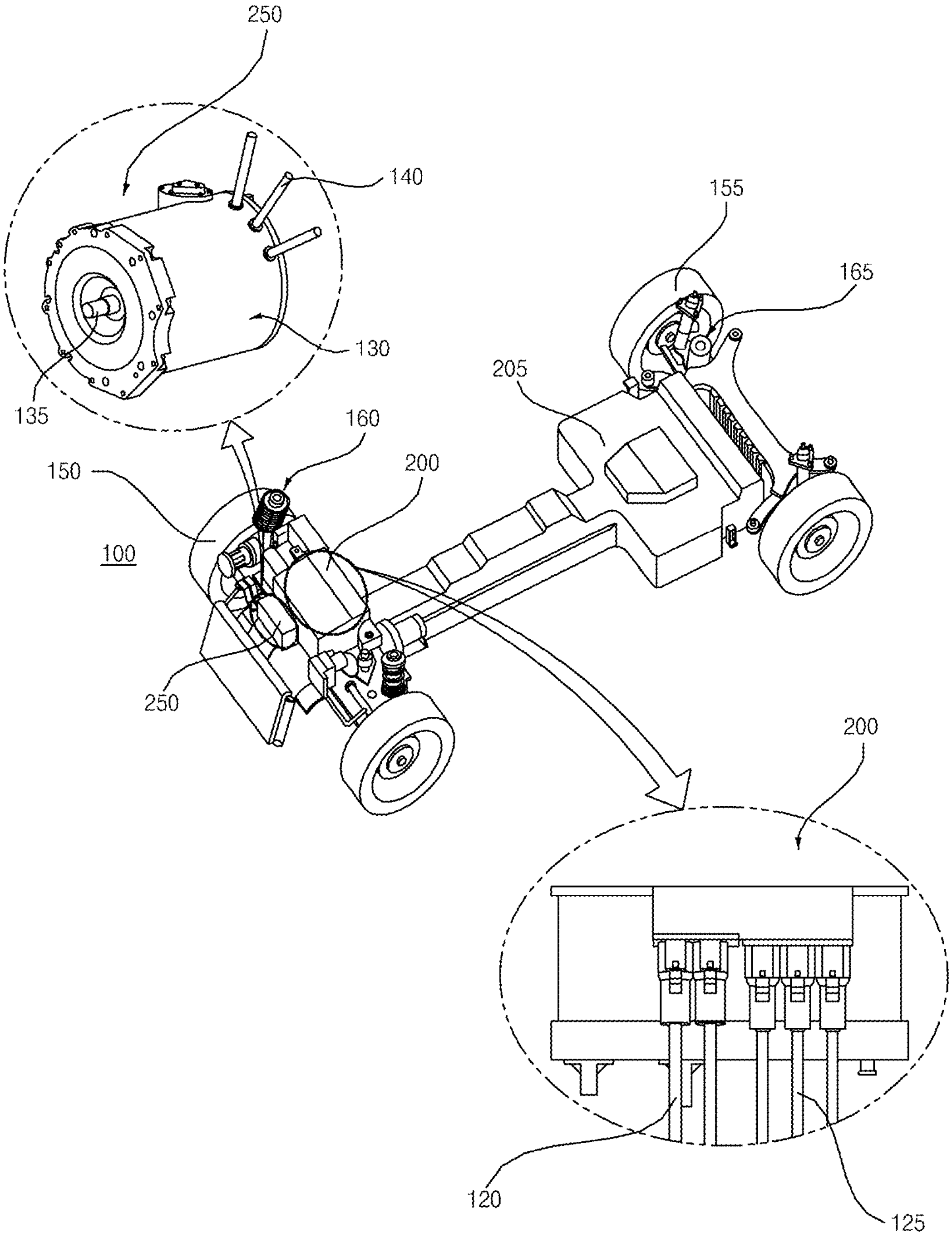
FIG. 1 is a schematic view showing a vehicle body of a vehicle according to an embodiment of the present disclosure.

FIG. 1 is a schematic view showing a vehicle body of a vehicle according to an embodiment of the present disclosure.

Referring to the drawing, a vehicle 100 according to an embodiment of the present disclosure may include a battery 205 for supplying power, a motor driving device 200 that is supplied with power from the battery 205, a motor 250 that is driven and rotated by the motor driving device 200, a front wheel 150 and a rear wheel 155 that are rotated by the motor 250, a front wheel suspension device 160 and a rear wheel suspension device 165 that prevent the vibration due to the road surface from being transmitted to a vehicle body, an inclination angle detector 190 for detecting the inclination angle of the vehicle body. Meanwhile, a drive gear (not shown) for converting the rotational speed of the motor 250 based on a gear ratio may be additionally provided.

The battery 205 supplies power to the motor driving device 200. In particular, the DC power is supplied to a capacitor C in the motor driving device 200.

The battery 205 may be formed of a plurality of unit cells. The plurality of unit cells may be managed by a battery management system (BMS) to maintain a constant voltage, and may emit a constant voltage by the battery management system.

For example, the battery management system may detect the voltage Vbat of the battery 205, and transmit the detected voltage Vbat to an electronic controller (not shown) or an inverter controller 430 inside the motor driving device 200, may supply the DC power stored in a capacitor C in the motor driving device 200 to the battery when the battery voltage Vbat falls down to or below a lower limit. In addition, when the battery voltage Vbat rises up to or above an upper limit, DC power may be supplied to the capacitor C in the motor driving device 200.

The battery 205 is preferably configured as a secondary battery capable of charging and discharging, but is not limited thereto.

The motor driving device 200 receives DC power from the battery 205 via a power input cable 120. The motor driving device 200 converts the DC power received from the battery 205 into AC power and supplies to the motor 250. The converted AC power is preferably a three-phase AC power. The motor driving device 200 supplies three-phase AC power to the motor 250 through a three-phase output cable 125 provided in the motor driving device 200.

Although FIG. 1 shows that the motor driving device 200 has the three-phase output cable 125 composed of three cables, but three cables may be provided in a single cable.

Meanwhile, the motor driving device 200 according to an embodiment of the present disclosure will be described later with reference to FIG. 3 and below.

The motor 250 includes a stator 130 that is fixed without rotation and a rotor 135 that rotates. The motor 250 is provided with an input cable 140 to receive AC power supplied from the motor driving device 200. The motor 250 may be, for example, a three-phase motor, and the rotation speed of the rotor may be varied based on the applied frequency, when a voltage variable/frequency variable each phase AC power is applied to the coil of the stator of each phase.

The motor 250 may be implemented in various forms such as an induction motor, a blushless DC motor (BLDC) motor, a reluctance motor, and the like.

Meanwhile, one side of the motor 250 may be provided with a drive gear (not shown). The drive gear converts the rotational energy of the motor 250 based on the gear ratio. The rotational energy output from the drive gear is transmitted to the front wheel 150 and/or the rear wheel 155 to move the vehicle 100.

The front wheel suspension device 160 and the rear wheel suspension device 165 support the front wheel 150 and the rear wheel 155 respectively with respect to the vehicle body. The vertical direction of the front wheel suspension device 160 and the rear wheel suspension device 165 is supported by a spring or a damping mechanism so that the vibration due to the road surface does not affect the vehicle body.

The front wheel 150 may be further provided with a steering device (not shown). The steering device is a device for adjusting the direction of the front wheel 150 in order to drive the vehicle 100 in a direction intended by the driver.

Meanwhile, although not shown in the drawing, the vehicle 100 may further include an electronic controller for controlling the overall electronic devices in the vehicle. The electronic controller (not shown) controls each device to perform an operation, display, and the like. In addition, the above-described battery management system may be controlled.

Figure 2:
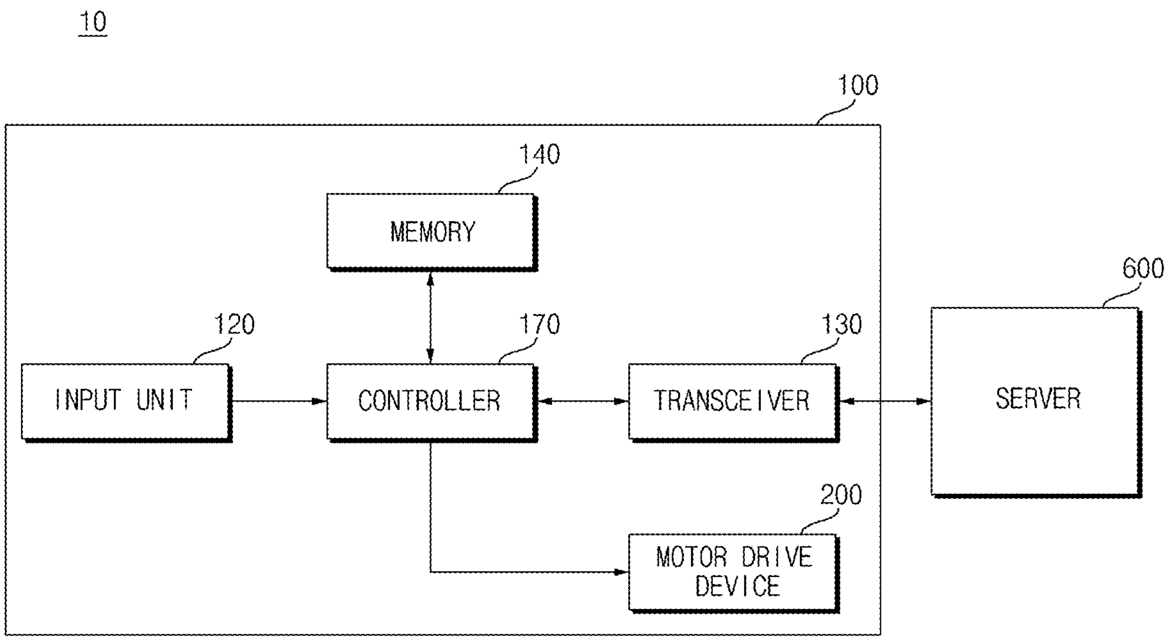
FIG. 2 is an example of a motor drive system according to an embodiment of the present disclosure.

Further, the controller 170 of FIG. 2 may generate driving command values according to various driving modes (driving mode, reverse mode, neutral mode, parking mode, etc.) based on detection signals from an inclination angle detector (not illustrated) that detects an inclination angle of the vehicle 100, a speed detector (not illustrated) that detects a speed of the vehicle 100, a brake detector (not illustrated) according to an operation of a brake pedal, an accelerator detector (not illustrated) according to an operation of an accelerator pedal, etc. The driving command value at this time may be, for example, a torque command value.

Meanwhile, the vehicle 100 according to the embodiment of the present disclosure may include a hybrid electric vehicle using a battery and a motor while using an engine, as well as a pure electric vehicle using a battery and a motor.

In this case, the hybrid electric vehicle may further include a switching means capable of selecting at least one of a battery and an engine, and a transmission.

Meanwhile, the hybrid electric vehicle may be divided into a series method of driving the motor by converting the mechanical energy output from the engine into electrical energy, a parallel method of using the mechanical energy output from the engine and the electrical energy from the battery at the same time, and a series-parallel method of mixing them.

FIG. 2 is an example of a motor drive system according to an embodiment of the present disclosure.

Referring to the drawing, the motor driving system according to an embodiment of the present disclosure may include a vehicle 100 and a server 500.

Here, the server 500 may be a server operated by the manufacturer of the motor driving device 200 or the vehicle 100, or may correspond to a mobile terminal of the driver of the motor driving device 200 or the vehicle 100.

Meanwhile, the vehicle 100 may include an input device 120, a transceiver 130, a memory 140, a controller 170, and a motor driving device 200.

The input device 120 may include an operation button, a key, and the like, and output an input signal for power on/off, operation setting, etc. of the vehicle 100.

The transceiver 130 may exchange data with an external device, for example, the server 500 by wire or wirelessly, or may exchange data wirelessly with a remote server, or the like. For example, the transceiver 130 may perform mobile communication such as 4G or 5G, infrared (IR) communication, RF communication, Bluetooth communication, Zigbee communication, WiFi communication, and the like.

Meanwhile, the memory 140 of the vehicle 100 may store data necessary for the operation of the vehicle 100. For example, the memory 140 may store data related to an operation time, an operation mode, and the like during operation of the motor driving device 200.

In addition, the memory 140 of the vehicle 100 may store management data including power consumption information of the vehicle, recommend driving information, current driving information, and management information.

In addition, the memory 140 of the vehicle 100 may store diagnostic data including operation information, driving information, and error information of the vehicle.

The controller 170 may control each unit in the vehicle 100. For example, the controller 170 may control the input device 120, the transceiver 130, the memory 140, the motor driving device 200, and the like.

The motor driving device 200 may be referred to as a motor driver, as a driver, to drive the motor 250.

Meanwhile, the motor driving device 200 may include an inverter 420 including a plurality of inverter switching elements and outputting AC power to the motor 250, an output current detector E configured to detect an output current (io) flowing on the motor 250, and an inverter controller 430 outputting a switching control signal to the inverter 420 based on current information id and iq, and a torque command value T* based on an output current io detected by the output current detector E.

Meanwhile, the current information (id, iq) based on the output current io and the torque command value T* may be transmitted to the external server 500, and may receive a current command value (i*d, i*q) from the server 500. The inverter controller 430 may output a switching control signal to the inverter 420, based on the current command value received from the transceiver 130.

Accordingly, the motor 250 may be driven based on the current command value corresponding to the maximum torque calculated in real time by the server 500. Thus, maximum torque drive of the motor 250 can be achieved.

Meanwhile, the transceiver 130 in the motor driving device 200 may transmit the current information (id, iq), the torque command value T*, and the voltage information related to the detected dc terminal voltage Vdc to the server 500. Accordingly, the maximum torque drive of the motor 250 under various conditions can be achieved.

Meanwhile, the detailed operation of the motor driving device 200 is described with reference to FIG. 3.

Figure 3:
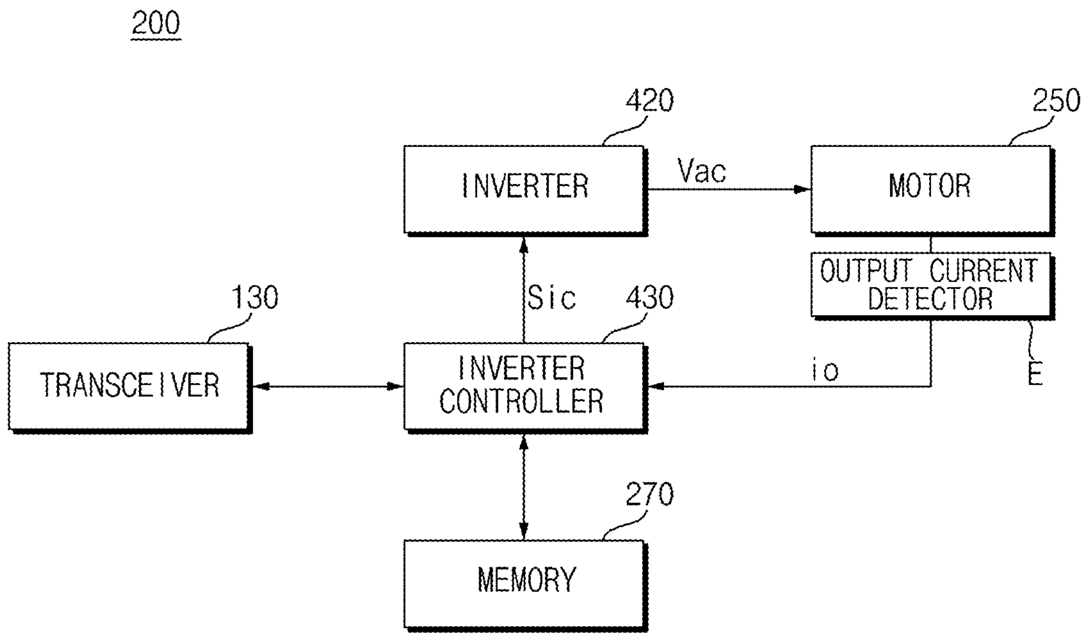
FIG. 3 illustrates an example of an internal block diagram of a motor driving device of FIG. 2.

FIG. 3 illustrates an example of an internal block diagram of a motor driving device of FIG. 2.

Referring to the drawing, the motor driving device 200 according to the embodiment of the present disclosure is a drive device for driving the motor 250, and may include an inverter 420 which has a plurality of inverter switching elements (Sa~Sc, S'a S'c) and outputs AC power to the motor 250, and an inverter controller 430 for controlling the inverter 420. Further, it may include a memory 270 that provides various stored data to the inverter controller 430.

Meanwhile, the motor driving device 200 according to the embodiment of the present disclosure may further include a capacitor C that stores a dc-terminal voltage Vdc corresponding to an input terminal of the inverter 420, a dc-terminal voltage detector B that detects the dc-terminal voltage Vdc, an output current detector E that detects the output current flowing on the motor 250, and a position detection sensor 105.

According to the embodiment of the present disclosure, the motor 250 may be a three-phase motor driven by the inverter 420.

Meanwhile, the inverter controller 430 may output the switching control signal Sic to the inverter 420, based on the current command value (i*d, i*q) corresponding to the calculated maximum torque. Accordingly, maximum torque driving of the motor 250 can be achieved.

The inverter controller 430 according to the embodiment of the present disclosure calculates the current information (id, iq) and the torque command value T* in real time, calculates the current command value (i*d, i*q) based on the torque command value T*, and drives the motor 250 using the current command values (i*d, i*q). Accordingly, the accuracy for high efficiency driving is improved.

Meanwhile, the motor driving device 200 may further include a capacitor C for storing the dc terminal voltage Vdc, corresponding to an input terminal of the inverter 420, and a dc terminal voltage detector (B) for detecting the dc terminal voltage Vdc.

The inverter controller 430 calculates the current command value (i*d, i*q), based on the current information id, iq, the torque command value T*, and the detected dc terminal voltage Vdc, and drives the motor 250 by using the current command value i*d and i*q. Accordingly, the accuracy for high efficiency driving is improved.

Figure 4:
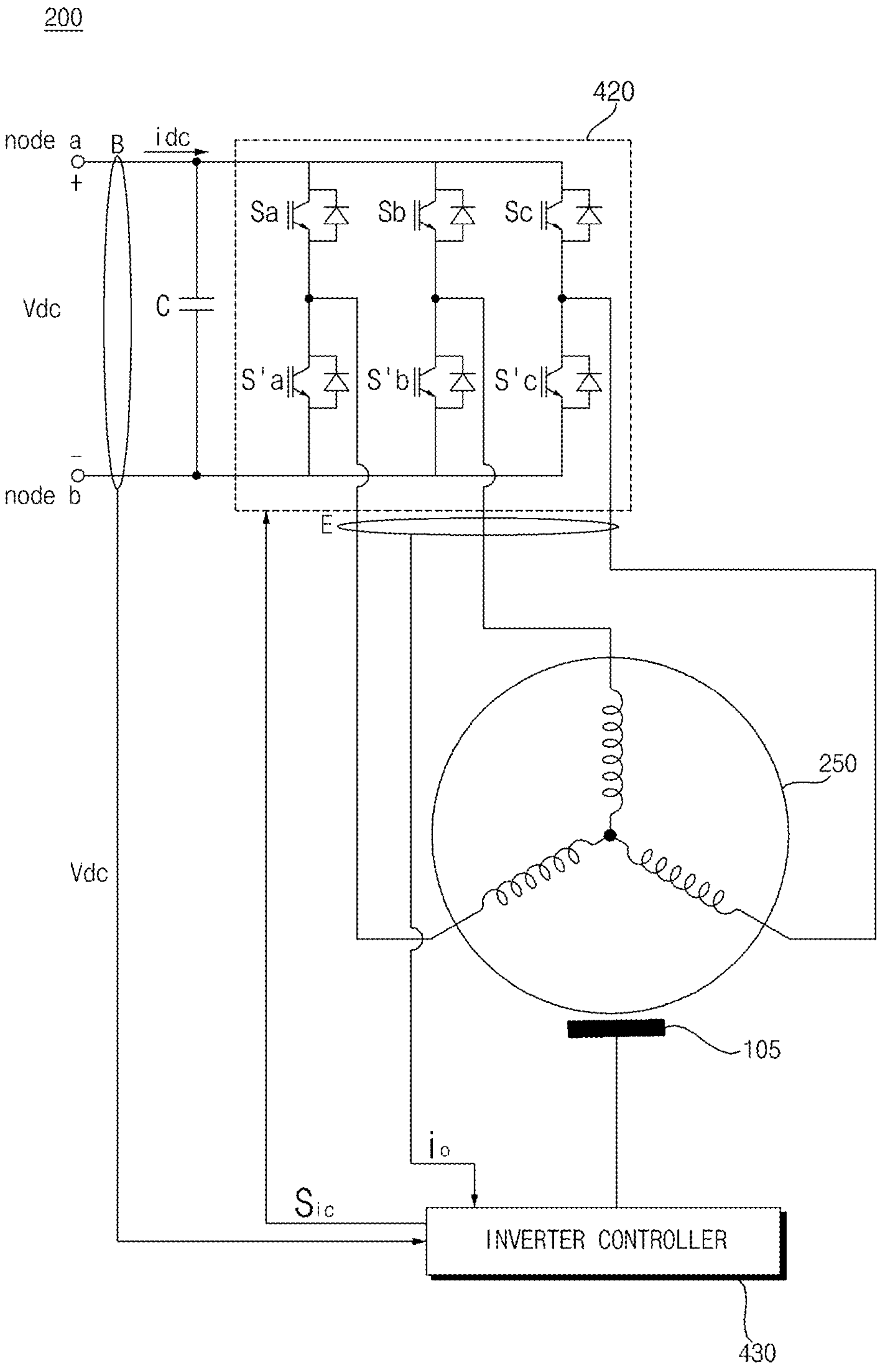
FIG. 4 is an example of an internal circuit diagram of the motor driving device of FIG. 3.

FIG. 4 is an example of an internal circuit diagram of the motor driving device of FIG. 3.

Referring to the drawing, the motor driving device 200 according to an embodiment of the present disclosure may include the inverter 420, the inverter controller 430, the output current detector E, the dc terminal voltage detector Vdc, and a position detection sensor 105.

Meanwhile, since the motor driving device 200 converts electric power to drive the motor, it may be referred to as a power converting device.

The dc terminal capacitor C stores the power input to the dc terminal (a-b terminal). In the drawing, a single device is exemplified as the dc terminal capacitor C, but a plurality of devices may be provided to ensure device stability.

Meanwhile, the input power supplied to the dc terminal capacitor C may be a power stored in the battery 205 or a power that is level-converted by a converter (not shown).

Meanwhile, since both ends of the dc terminal capacitor C store the DC power, these may be referred to as a dc terminal or a dc link terminal.

The dc terminal voltage detector B may detect the voltage Vdc of the dc terminal that is both ends of the dc terminal capacitor C. To this end, the dc terminal voltage detector B may include a resistor, an amplifier, and the like. The detected dc terminal voltage Vdc, as a discrete signal in the form of a pulse, may be input to the inverter controller 430.

The inverter 420 may include a plurality of inverter switching elements (Sa Sc, S'a~S'c), and the turning on/off operation of the switching element (Sa~Sc, S'a~S'c) may convert the DC power Vdc into three-phase AC power Va, Vb, Vc having a certain frequency and output to the three-phase synchronous motor 250.

In the inverter 420, the upper arm switching element Sa, Sb, Sc and the lower arm switching element S'a, S'b, S'c which are connected in series with each other form a pair, and a total of three pairs of upper and lower arm switching elements are connected in parallel with each other (Sa&S'a, Sb&S'b, Sc&S'c). Diodes are connected in anti-parallel to each of the switching elements Sa, S'a, Sb, S'b, Sc, S'c.

The switching elements in the inverter 420 perform on/off operation of the respective switching elements based on the inverter switching control signal Sic from the inverter controller 430. Thus, the three-phase AC power having a certain frequency is output to the three-phase synchronous motor 250.

The inverter controller 430 may be configured to control a switching operation of the inverter 420, based on a sensorless method.

To this end, the inverter controller 430 may receive an output current io detected by the output current detector E.

The inverter controller 430 may output an inverter switching control signal Sic to each gate terminal of the inverter 420 in order to control the switching operation of the inverter 420. Accordingly, the inverter switching control signal Sic may be referred to as a gate driving signal.

Meanwhile, the inverter switching control signal Sic is a switching control signal of the pulse width modulation method PWM, and is generated and output based on the output current io detected by the output current detector E.

The output current detector E detects the output current io flowing between the inverter 420 and the three-phase motor 250. That is, the current flowing in the motor 250 may be detected.

The output current detector E may detect all of the output currents ia, ib, ic of each phase, or may detect the output currents of two phases by using three-phase equilibrium.

The output current detector E may be positioned between the inverter 420 and the motor 250, and a current transformer (CT), a shunt resistor, or the like may be used for current detection.

The detected output current io, as a discrete signal in the form of a pulse, may be applied to the inverter controller 430, and a switching control signal Sic is generated based on the detected output current io.

The position detection sensor 105 may sense rotor position information θ of the motor 250. The sensed position information θ may be input to the inverter controller 430.

Meanwhile, the three-phase motor 250 includes a stator and a rotor, and AC power of each phase having a certain frequency is applied to a coil of the stator of each phase (a, b, c phase), so that the rotor rotates.

Such a motor 250 may include, for example, a Surface-Mounted Permanent-Magnet Synchronous Motor (SMPMSM), an Interior Permanent Magnet Synchronous Motor (IPMSM), a Synchronous Reluctance Motor (Synrm), and the like. Among these, SMPMSM and IPMSM are a permanent magnet synchronous motor (PMSM) to which permanent magnet is applied, and Synrm has no permanent magnet.

Meanwhile, the motor 250 according to the embodiment of the present disclosure is described mainly based on an Interior Permanent Magnet Synchronous Motor (IPMSM).

Figure 5:
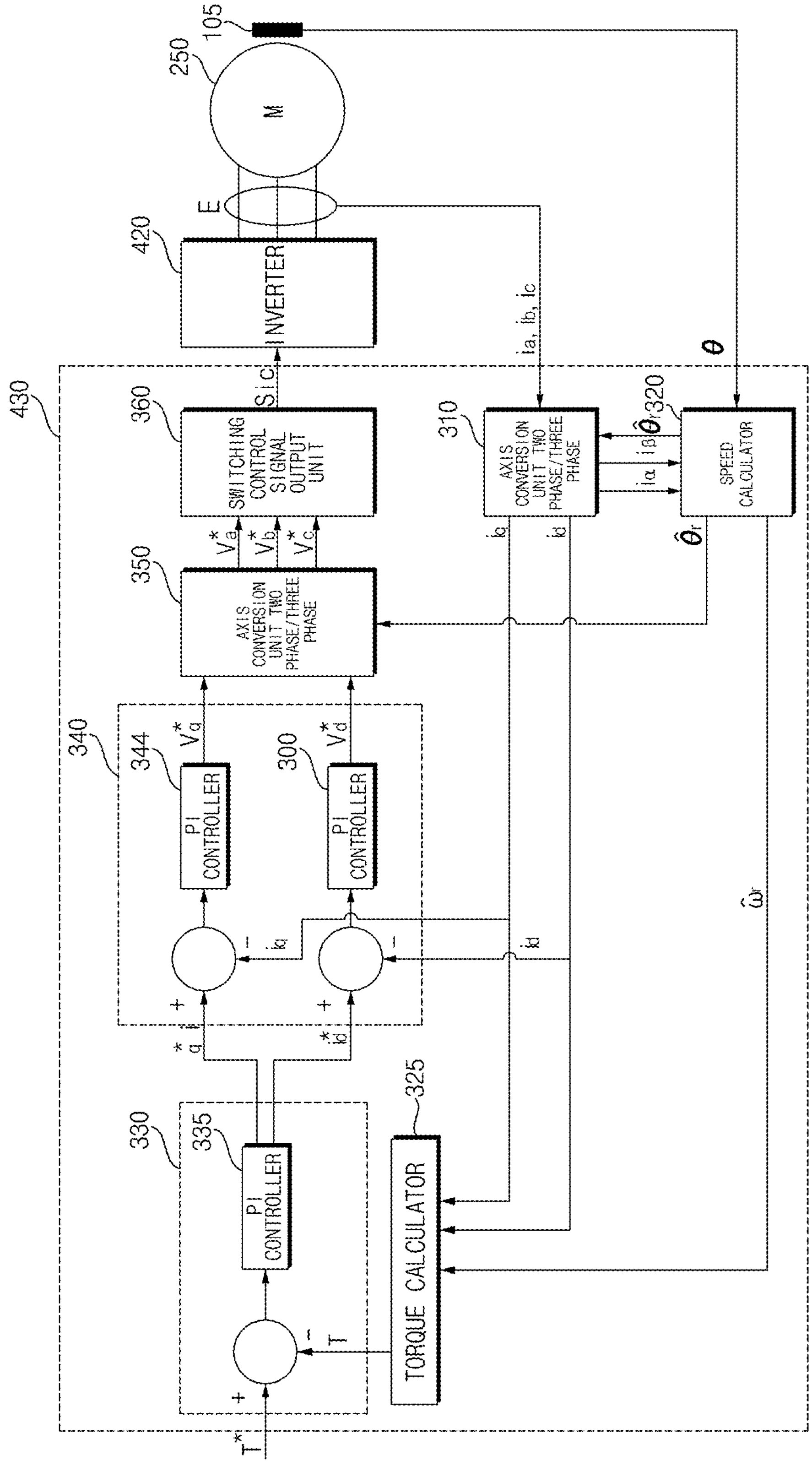
FIG. 5 is an example of an internal block diagram of an inverter controller of FIG. 4.

FIG. 5 is an example of an internal block diagram of an inverter controller of FIG. 4.

Referring to the drawing, the inverter controller 430 of FIG. 5 may receive the detected output current io from the output current detector 320, and receive rotor position information θ of the motor 250 from the position detection sensor 105.

The position detection sensor 105 may detect the magnetic pole position θ of the rotor of the motor 250. That is, the position detection sensor 105 may detect the position of the rotor of the motor 250.

To this end, the position detection sensor 105 may include an encoder, a resolver, or the like.

In the following descriptions, the coordinate system and coordinate axis used are defined here.

The αβ coordinate system is a two-dimensional fixed coordinate system whose axes are α and β axes which are fixed axes. The α and β axes are orthogonal to each other, and the β axis leads the a axis by electrical angle 90°.

The dq coordinate system is a two-dimensional rotary coordinate system having d and q axes that are rotational axis. In the rotary coordinate system that rotates at the same speed as the rotational speed of the magnetic flux made by the permanent magnet of the motor 250, the axis according to the direction of the magnetic flux made by the permanent magnet is the d axis, and the axis that leads the d axis by electrical angle 90 degrees is the q axis.

Referring to FIG. 5, the inverter controller 430 may include a speed calculator 320, an axis converter 310, a torque calculator 325, a current command generator 330, a voltage command generator 340, an axis converter 350, and a switching control signal output portion 360.

The axis converter 310 in the inverter controller 430 receives the three-phase output current (ia, ib, ic) detected by the output current detector E, and converts into a two-phase current (iα, iβ) of the stationary coordinate system.

Meanwhile, the axis converter 310 may convert the two-phase current (iα, iβ) of the stationary coordinate system into a two-phase current (id, iq) of the rotary coordinate system.

The speed calculator 320 in the inverter controller 430 estimates the rotor position of the motor 250, based on the two-phase current (iα, iβ) of the stationary coordinate system converted by the axis converter 310. In addition, based on the estimated rotor position, the calculated speed may be output.

The torque calculator 325 in the inverter controller 430 may calculate the current torque T, based on the calculated speed.

The current command generator 330 in the inverter controller 430 generates the current command values (i*d, i*q), based on the calculated current torque T and the torque command value T*.

For example, the current command generator 330 performs a PI control in a PI controller 335, based on the calculated current torque T and the torque command value T*, and may generate the current command value (i*d, i*q). Meanwhile, the value of the d-axis current command value i*d may be set to zero.

Meanwhile, the current command generator 330 may further include a limiter (not shown) for restricting the level so that the current command value (i*d, i*q) does not exceed an allowable range.

Next, the voltage command generator 340 generates d-axis and q-axis voltage command values (V*d, V*q), based on the d-axis and q-axis currents (id, iq) that are axis-converted into two-phase rotary coordinate system by the axis converter, and the current command value (i*d, i*q) in the current command generator 330, or the like.

For example, the voltage command generator 340 may perform the PI control in the PI controller 344, based on a difference between the q-axis current iq and the q-axis current command value i*q, and may generate the q-axis voltage command value V*q. In addition, the voltage command generator 340 may perform the PI control in the PI controller 348, based on a difference between the d-axis current id and the d-axis current command value i*d, and may generate the d-axis voltage command value V*d. Meanwhile, the value of the d-axis voltage command value V*d may be set to zero, in correspondence with the case where the value of the d-axis current command value i*d is set to zero.

Meanwhile, the voltage command generator 340 may further include a limiter (not shown) for restricting the level so that the d-axis and q-axis voltage command values (V*d, V*q) do not exceed the allowable range.

Meanwhile, the generated d-axis and q-axis voltage command values (V*d, V*q) are input to the axis converter 350.

The axis converter 350 receives the position calculated by the speed calculator 320 and the d-axis and q-axis voltage command values (V*d, V*q), and performs axis conversion.

First, the axis converter 350 performs conversion from a two-phase rotary coordinate system to a two-phase stationary coordinate system. In this case, the position calculated by the speed calculator 320 may be used.

In addition, the axis converter 350 performs conversion from two-phase stationary coordinate system to three-phase stationary coordinate system. Through this conversion, the axis converter 350 outputs the three-phase output voltage command value (V*a, V*b, V*c).

The switching control signal output portion 360 generates and outputs a switching control signal Sic according to the pulse width modulation PWM method based on the three-phase output voltage command value (V*a, V*b, V*c).

The output inverter switching control signal Sic may be converted into a gate driving signal by a gate motor driving device (not shown), and input to the gate of each switching element in the inverter 420. Thus, each of the switching elements (Sa, S'a, Sb, S'b, Sc, S'c) in the inverter 420 performs a switching operation.

Figure 6A:
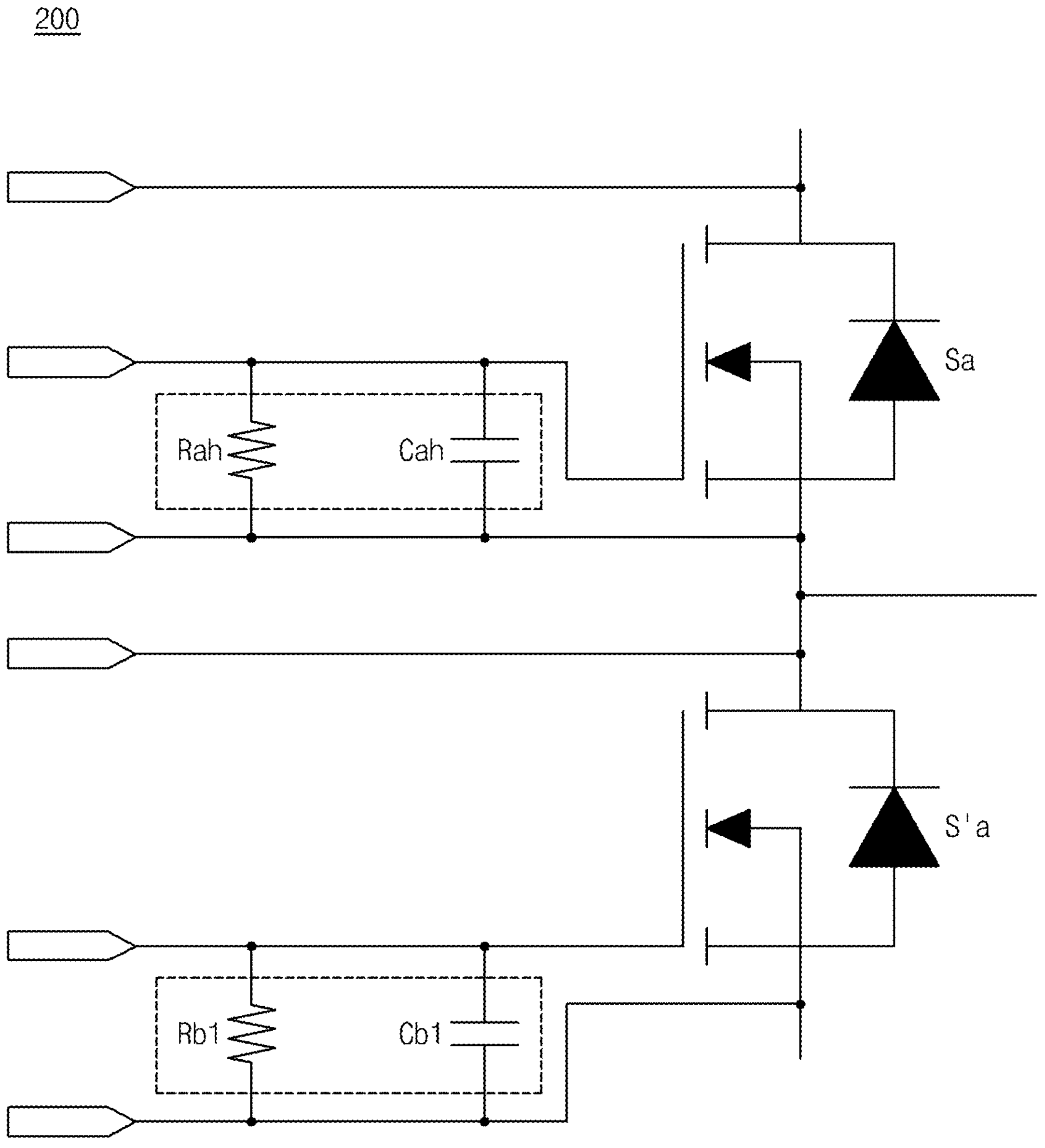
FIGS. 6A and 6B are views referred to in the description of an inverter FIG. 4.
Figure 6B:
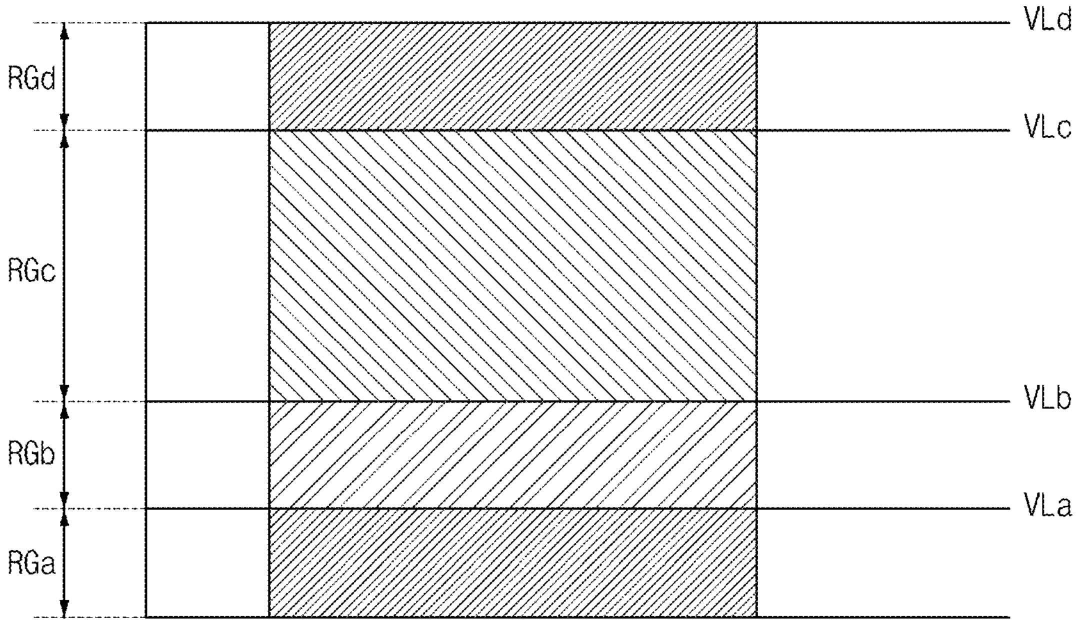

FIGS. 6A and 6B are views referred to in the description of an inverter FIG. 4.

Referring to the drawings, the inverter 420 in the motor driving device 200 has a pair of an upper inverter switching element Sa and a lower inverter switching element S'a that are connected in series with each other.

Besides, the inverter 420 in the motor driving device 200 further includes an upper inverter switching element Sb and a lower inverter switching element S'b connected to a pair of switching elements Sa and S'a in parallel, and connected to each other in series.

Besides, the inverter 420 in the motor driving device 200 further includes an upper inverter switching element Sc and a lower inverter switching element S'c connected to two pairs of switching elements Sa and S'a and Sb and S'b in parallel, and connected to each other in series.

Meanwhile, an upper gate resistor Rah and a lower gate capacitor Csh are connected to each of upper inverter switching element Sa to Sc.

Based on RC time constants of the upper gate resistor Rah and the lower gate capacitor Csh, a rising slope at turn-on of each of the upper inverter switching elements Sa to Sc is determined, and a falling slope at turn-off is determined.

Meanwhile, a lower gate resistor Rb1 and a lower gate capacitor Cb1 are connected to each of the upper inverter switching elements Sa to Sc.

Based on RC time constants of the lower gate resistor Rb1 and the lower gate capacitor Cb1, a rising slope at turn-on of each of the lower inverter switching elements S'a to S'c is determined, and a falling slope at turn-off is determined.

In the drawing, the upper gate resistor Rah and the lower gate capacitor Csh connected to the upper inverter switching element Sa corresponding to phase a among three pairs of switching elements in the inverter 420, and the lower gate resistor Rb1 and the lower gate capacitor Cb1 connected to the lower inverter switching element S'a corresponding to phase a are exemplified.

FIG. 6B is a view illustrating a range of voltage Vdc of a dc terminal (a-b terminal), corresponding to an input terminal of the inverter 420.

Referring to the drawing, the voltage Vdc of the dc terminal (a-b terminal) which is the input terminal of the inverter 420 may be roughly divided into a plurality of ranges.

In the drawing, the voltage Vdc may be divided into a first voltage range RGd which is an overvoltage voltage range, a second voltage range RGc which is an operating voltage range at a level lower than the first voltage range RGd, a third voltage range RGb which is a limited operating voltage range at a level lower than the second voltage range RGc, and a fourth voltage range RGa which is a low residual voltage range at a level lower than the third voltage range RGb.

For example, when the inverter 420 is an inverter for approximately 800 V, a boundary voltage VLa of the third voltage range RGb and the fourth voltage range RGa may be approximately 350 V, a boundary voltage VLb of the second voltage range RGc and the third voltage range RGb may be approximately 650 V, a boundary voltage VLc of the first voltage range RGd and the second voltage range RGc may be approximately 850 V, and a voltage VLd of an upper boundary of the first voltage range RGd may be approximately 900 V.

Meanwhile, the voltage Vdc of the input terminal of the inverter 420, the dc terminal (a-b terminal), mostly maintains the second voltage range RGc, and the first voltage range RGd intermittently appears.

Meanwhile, when a plurality of inverter switching elements Sa to Sc and S'a to S'c within the inverter 420 perform switching operations in a state in which the voltage Vdc of the dc terminal (a-b terminal) which is the input terminal of the inverter 420, a significant switching loss occurs, which ultimately results in a decrease in the efficiency of the inverter.

Figure 7A:
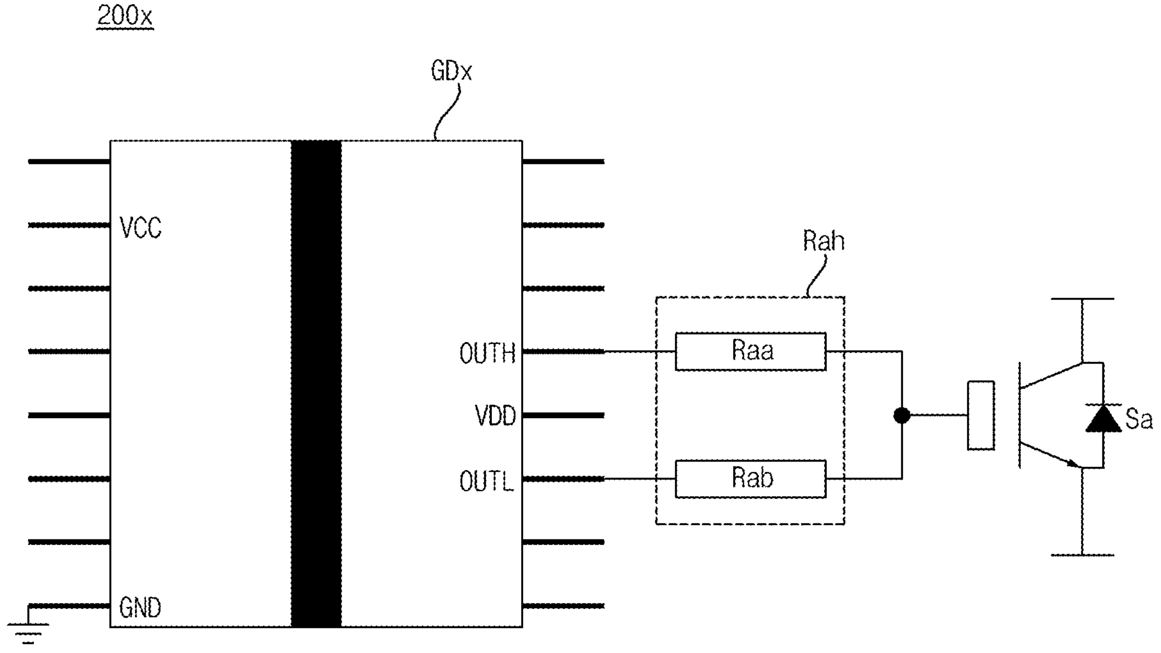
FIG. 7A is an example of a motor driving device related to the present disclosure.

FIG. 7A is an example of a motor driving device related to the present disclosure.

Referring to the drawings, a motor driving device 200*x* related to the present disclosure may include an upper inverter switching element Sa, a gate driver GDx that outputs a gate signal to the upper inverter switching element Sa, and a gate resistor Rah disposed between the upper inverter switching element Sa and the gate driver GDx.

Meanwhile, the gate resistor Rah may be divided into a gate on resistor Raa and a gate off resistance Rab.

Figure 7B:
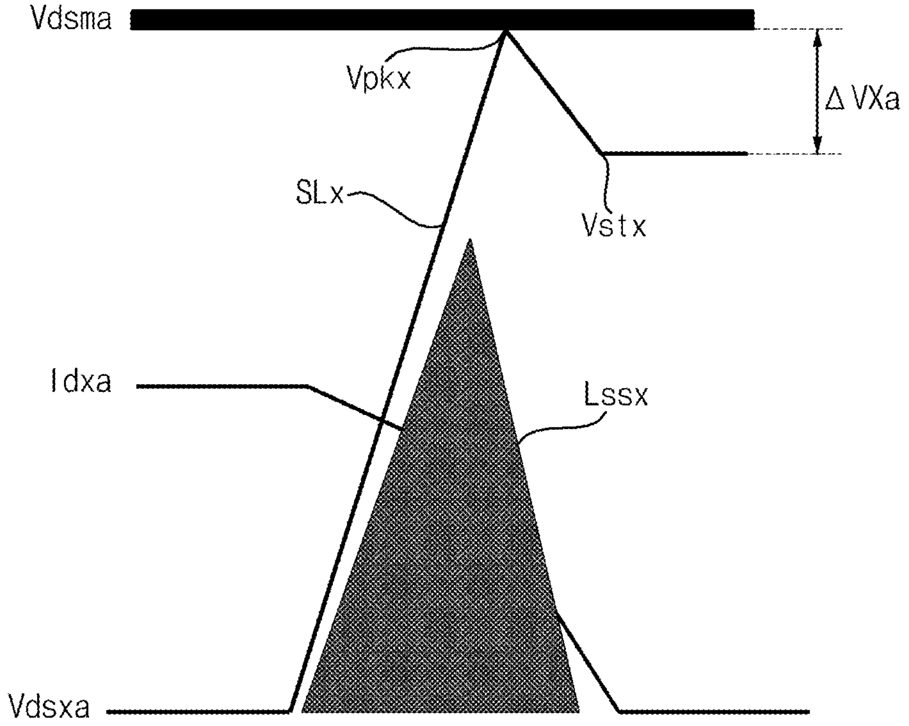
FIGS. 7B and 7C are views referred to in the description of FIG. 7A.
Figure 7C:
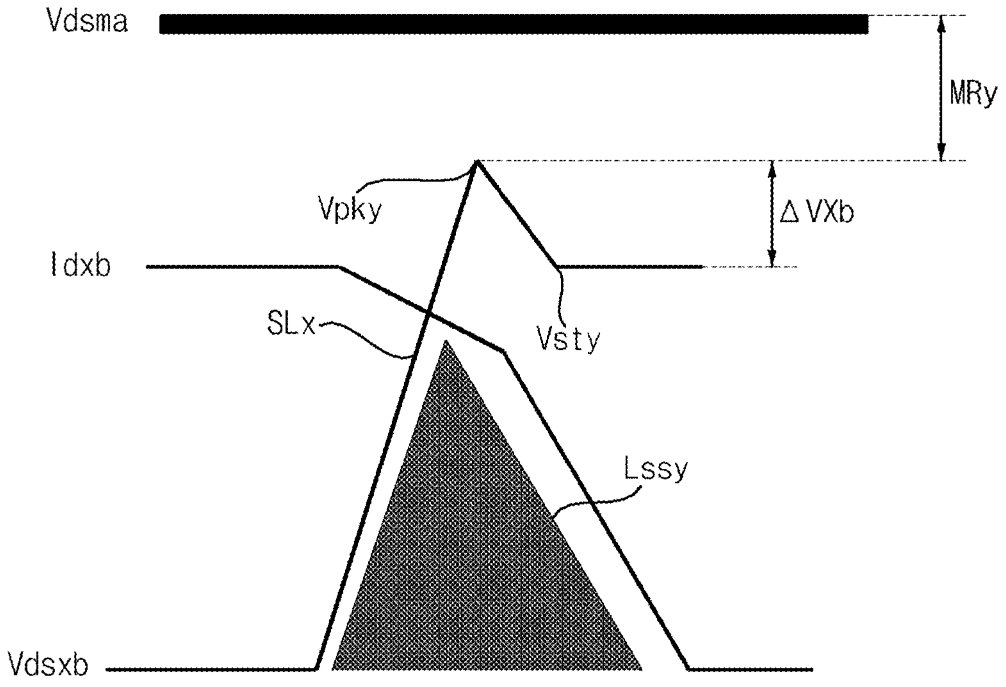

FIGS. 7B and 7C are views referred to in the description of FIG. 7A.

First, FIG. 7B is a view illustrating a switching voltage Vdsxa and a switching current Idxa when the DC voltage of the first voltage range RGd of FIG. 6B is applied to the upper inverter switching element Sa in the motor driving device 200*x* of FIG. 7A.

Referring to the drawing, a gate signal output from a first output terminal OUTH of the gate driver GDx is applied to the upper inverter switching element Sa via the gate on resistor Raa.

Accordingly, the switching voltage Vdsxa rises to a peak voltage Vpkx, which is a maximum allowable voltage Vsdma, according to a predetermined rising slope SLx according to the RC time constant based on the gate on resistor Raa, and then falls to maintain a constant voltage Vstx.

A switching loss Lssx is generated by the switching voltage Vdsxa and the switching current Idxa.

Next, FIG. 7C is a view illustrating a switching voltage Vdsxb and a switching current Idxb when the DC voltage of the second voltage range RGc of FIG. 6B is applied to the upper inverter switching element Sa in the motor driving device 200*x* of FIG. 7A.

Referring to the drawing, the gate signal output from the first output terminal OUTH of the gate driver GDx is applied to the upper inverter switching element Sa via the gate on resistor Raa.

Accordingly, the switching voltage Vdsxb rises to a peak voltage Vpky, which is the maximum allowable voltage Vsdma, according to the predetermined rising slope SLx according to the RC time constant based on the gate on resistor Raa, and then falls to maintain a constant voltage Vsty.

A switching loss Lssy is generated by the switching voltage Vdsxb and the switching current Idxb.

Meanwhile, comparing FIG. 7B and FIG. 7C, since the gate on resistor Raa is the same, the rising slope SLx appears the same in each switching voltage waveform.

Accordingly, even if the voltage Vdc of the dc terminal (a-b terminal) which is the input terminal of the inverter 420 is varied, especially, even if the voltage Vdc is in the first voltage range RGd or the second voltage range RGc, the same voltage rising slope appears according to the same gate resistor, and eventually, the significant switching loss is generated.

Accordingly, the present disclosure proposes a method for reducing the switching loss of the inverter. In particular, the present disclosure proposes a method for changing the rising slope of an inverter switching element. This is described with reference to FIG. 8 or below.

Figure 8:
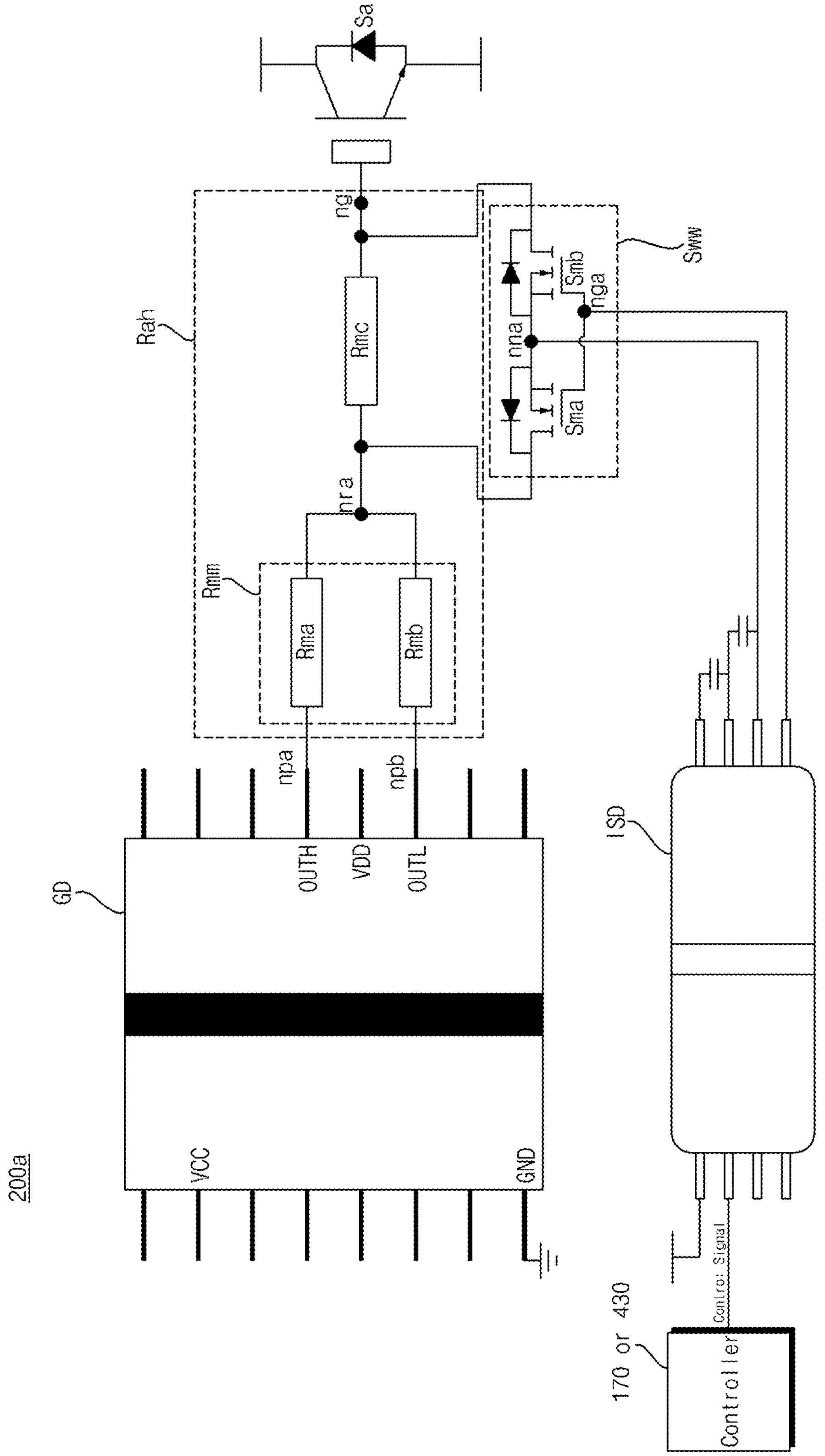
FIG. 8 is an example of a circuit diagram of the motor driving device according to an embodiment of the present disclosure.

FIG. 8 is an example of a circuit diagram of the motor driving device according to an embodiment of the present disclosure.

Referring to the drawing, a motor driving device 200*a* according to an embodiment of the present disclosure includes an inverter 420 including a plurality of inverter switching elements Sa to Sc and S'a to S'c, a gate driver GD which outputs a gate control signal to each of gate terminals of the plurality of inverter switching elements Sa to Sc and S'a to S'c, a first resistor Rmm and a second resistor Rmc which are arranged between the gate driver GD and the gate terminals of each of the inverter switching elements Sa to Sc and S'a to S'c, a resistance variable switching element Sww which is connected to both ends of the second resistor Rmc, and a switch driver ISD which outputs a switch control signal to the resistance variable switching element Sww.

In the drawing, it is illustrated that the motor driving device 200*a* according to an embodiment of the present disclosure includes a gate driver GD that outputs a gate control signal to a gate terminal of an a-phase upper inverter switching element Sa among the plurality of inverter switching elements Sa to Sc and S'a to S'c, a first resistor Rmm and a second resistor Rmc arranged between the gate driver GD and the gate terminal of the a-phase upper inverter switching element Sa, a resistance variable switching element Sww connected to both ends of the second resistor Rmc, and a switch driver ISD that outputs a switch control signal to the resistance variable switching element Sww.

The first resistor Rmm may be divided into a gate-on resistor Rma and a gate-off resistor Rmb.

In the drawing, it is illustrated that one end of the gate-on resistor Rma is connected to the first output terminal OUTH of the gate driver GD, one end of the second resistor Rmc is connected to the other end nra of the gate-on resistor Rma, and the gate terminal of the a-phase upper inverter switching element Sa is connected to the other end ng of the second resistor Rmc.

Meanwhile, one end of the gate-off resistor Rmb is connected to a second output terminal (OUTL) of the gate driver GD, one end of the second resistor Rmc is connected to the other end nra of the gate-off resistor Rmb, and the gate terminal of the a-phase upper inverter switching element Sa is connected to the other end ng of the second resistor Rmc.

Meanwhile, one end of the resistance variable switching element Sww is connected to one end nra of the second resistor Rmc, and the other end of the resistance variable switching element Sww is connected to the other end ng of the second resistor Rmc.

Meanwhile, a plurality of FETs may be connected to the resistance variable switching element Sww in series.

In the drawing, one end of an n-type first FET Sma is connected to an nra node, the other end of the first FET Sma is connected to an nna node, one end of an n-type second FET Smb is connected to the nna node, and the other end of the second FET Smb is connected to an ng node.

That is, the plurality of FETs Sma and Smb are connected in series between the both ends nra and ng of the second resistor Rmc.

Meanwhile, a common switch control signal from a switch driver ISD is input to the gate terminals of the plurality of FETs Sma and Smb.

Meanwhile, the motor driving device 200*a* according to the embodiment of the present disclosure further includes a controller 170 or an inverter controller 430 that controls the switch driver ISD.

Based on a control signal output from the controller 170 or the inverter controller 430, the switch driver ISD may output the common switch control signal.

Meanwhile, the controller 170 or the inverter controller 430 may be configured to turn on the upper inverter switching element Sa based on a first rising slope SLa according to the turn-off of the resistance variable switching element Sww, and turn on the upper inverter switching element Sa based on a second rising slope SLb greater than the first rising slope SLa according to the turn-on of the resistance variable switching element Sww. Accordingly, it is possible to change the rising slope of the upper inverter switching element Sa, and the switching loss of the inverter 420 may be reduced.

Meanwhile, the controller 170 or the inverter controller 430 may be configured to control a gate resistance of the upper inverter switching element Sa to be a first resistance value according to the turn-off of the resistance variable switching element Sww, and control the gate resistance of the upper inverter switching element Sa to be a second resistance value less than the first resistance value according to the turn-on of the resistance variable switching element Sww. Accordingly, it is possible to change the rising slope of the upper inverter switching element Sa, and the switching loss of the inverter 420 may be reduced.

Meanwhile, when the resistance variable switching element Sww is turned off based on the switch control signal from the switch driver ISD, the gate resistance has a value of Rma+Rmc, and based on this value, the a-phase upper inverter switching element Sa is turned on based on the first rising slope SLa.

Meanwhile, when the resistance variable switching element Sww is turned on based on the switch control signal from the switch driver ISD, the gate resistance has a value of Rma, and based on this value, the a-phase upper inverter switching element Sa is turned on based on the second rising slope SLb greater than the first rising slope SLa.

That is, when the resistance variable switching element Sww is turned on, the gate resistance becomes smaller, and accordingly, the rising slope of the upper inverter switching element Sa becomes greater, and the switching loss is further reduced.

Accordingly, the switching loss of the inverter 420 may be reduced. In particular, by changing the gate resistance through the operation of the resistance variable switching element Sww, the switching loss of the inverter 420 may be reduced.

Meanwhile, for effective switching loss reduction, it is desirable that the resistance value of the second resistor Rmc is greater than the resistance value of the first resistor Rmm. Accordingly, it is possible to change the rising slope of the upper inverter switching element Sa, and the switching loss of the inverter 420 may be reduced.

Meanwhile, a rising time when the gate terminal is turned on may be greater than a falling time when the gate terminal is turned off.

To this end, it is preferable that the resistance value of the gate-off resistor Rmb connected to the second output terminal OUTL of the gate driver GD is less than the gate-on resistor Rma connected to the first output terminal OUTH of the gate driver GD.

That is, it is desirable that a gate-on resistance Rgon of the gate terminal is greater than a gate-off resistance Rgoff. Accordingly, it is possible to reduce the switching loss by differentiating the rising and falling slopes.

FIG. 9A to 10D are views referred to in the description of FIG. 8.

Figure 9A:
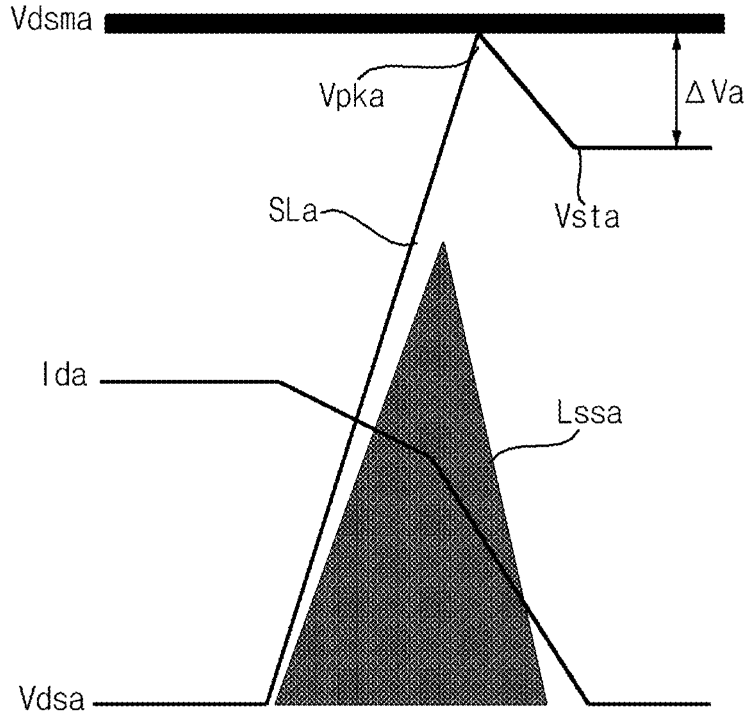
FIG. 9A to 10D are views referred to in the description of FIG. 8.

First, FIG. 9A is a view illustrating a switching voltage Vdsa and a switching current Ida when the DC voltage of the first voltage range RGd of FIG. 6B is applied to the upper inverter switching element Sa in the motor driving device 200 of FIG. 8.

The controller 170 or the inverter controller 430 is configured to turn on the upper inverter switching element Sa based on the first rising slope SLa in response to the voltage level of the dc terminal being in the first voltage range RGd.

Figure 10A:
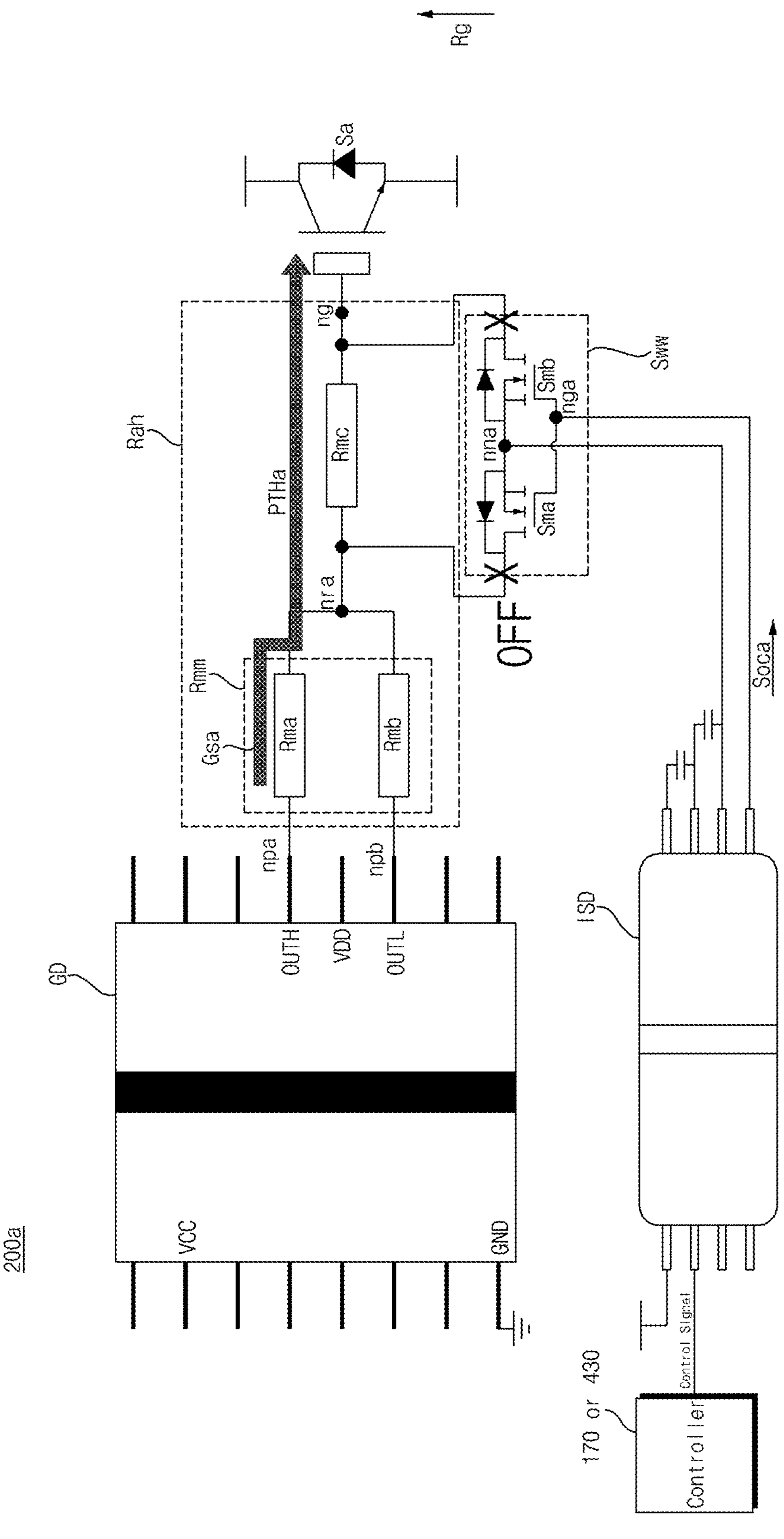
Figure 10B:
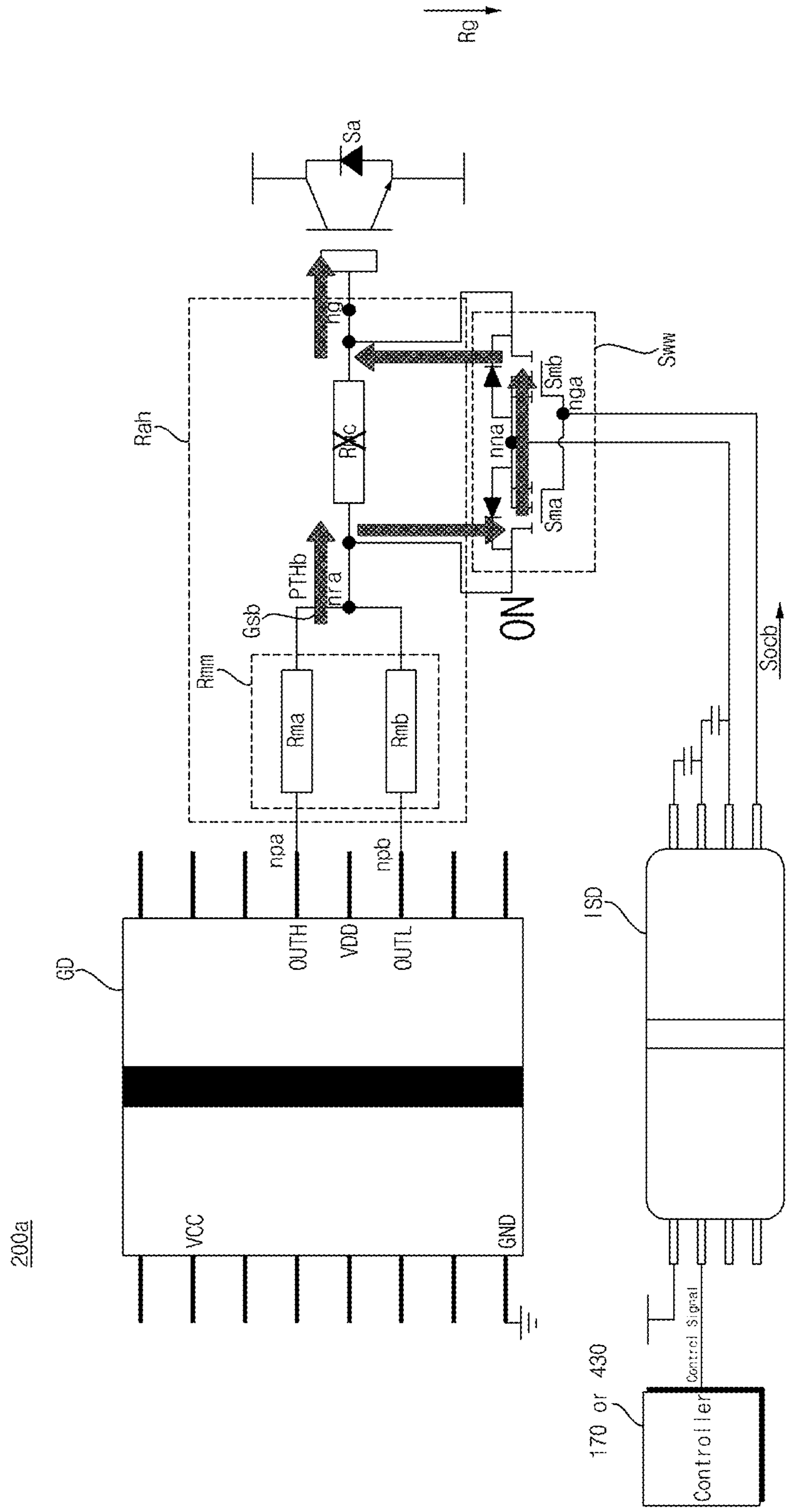
Figure 10C:
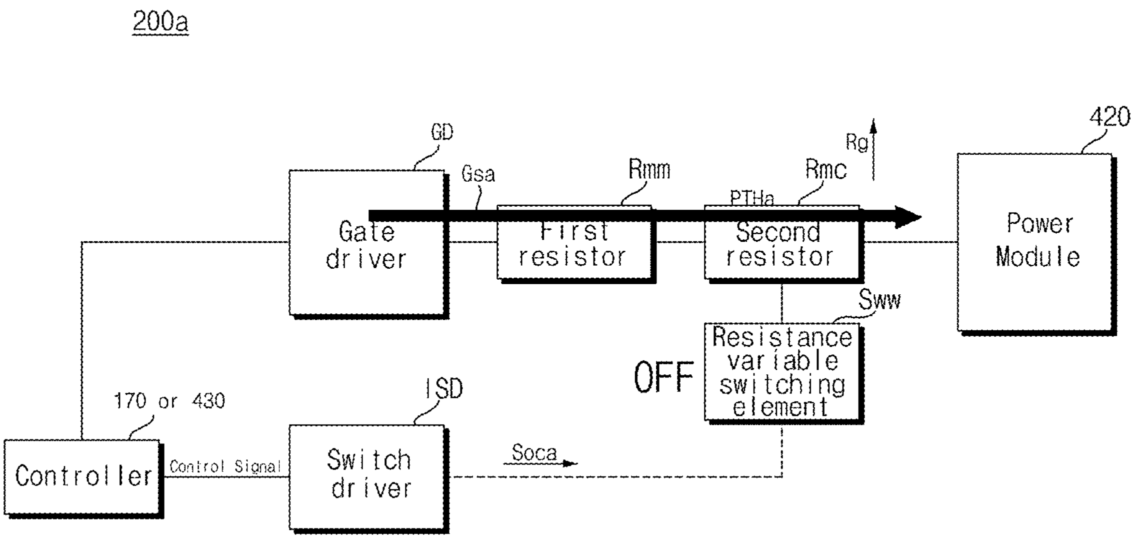

That is, the controller 170 or the inverter controller 430 is configured to turn off the resistance variable switching element Sww, as illustrated in FIG. 10A or FIG. 10C, in response to the voltage level of the dc terminal being in the first voltage range RGd.

Accordingly, a gate signal Gsa output from the first output terminal OUTH of the gate driver GD is applied to the upper inverter switching element Sa through the first resistor Rma and the second resistor Rmc.

Consequently, the switching voltage Vdsa rises to the peak voltage Vpka, which is the maximum allowable voltage Vsdma, according to the first rising slope SLa based on the first resistor Rma and the second resistor Rmc, and then falls to maintain the constant voltage Vsta.

A switching loss Lssa is generated due to the switching voltage Vdsa and the switching current Ida.

Figure 9B:
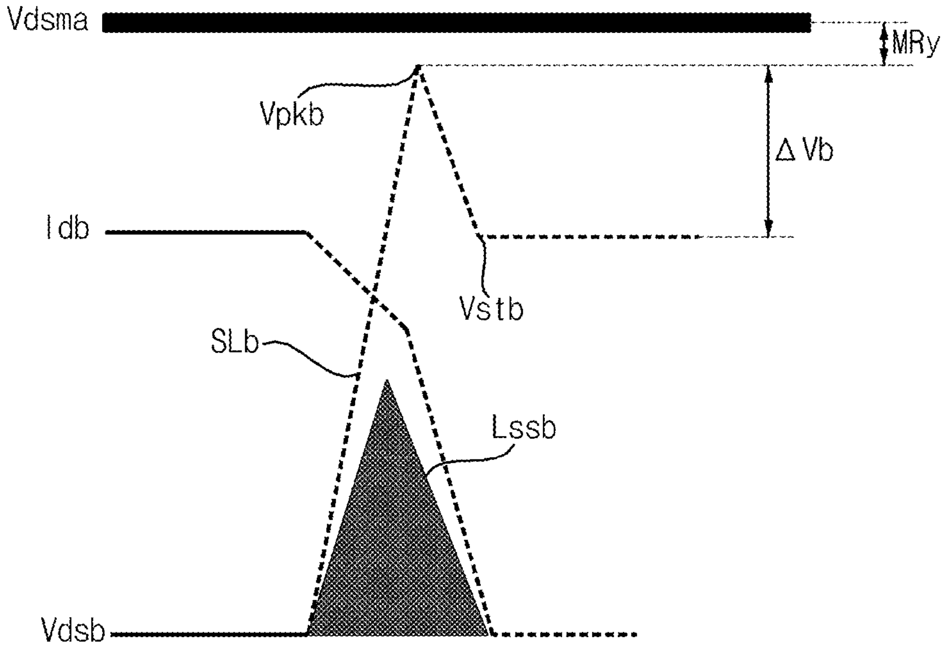

Next, FIG. 9B is a diagram illustrating a switching voltage Vdsb and a switching current Idb when the DC voltage of the second voltage range RGc of FIG. 6B is applied to the upper inverter switching element Sa in the motor driving device 200 of FIG. 8.

The controller 170 or the inverter controller 430 controls the upper inverter switching element Sa to be turned on based on the second rising slope SLb which is greater than the first rising slope SLa in response to the voltage level of the dc terminal being in the second voltage range RGc less than the first voltage range RGd.

Figure 10D:
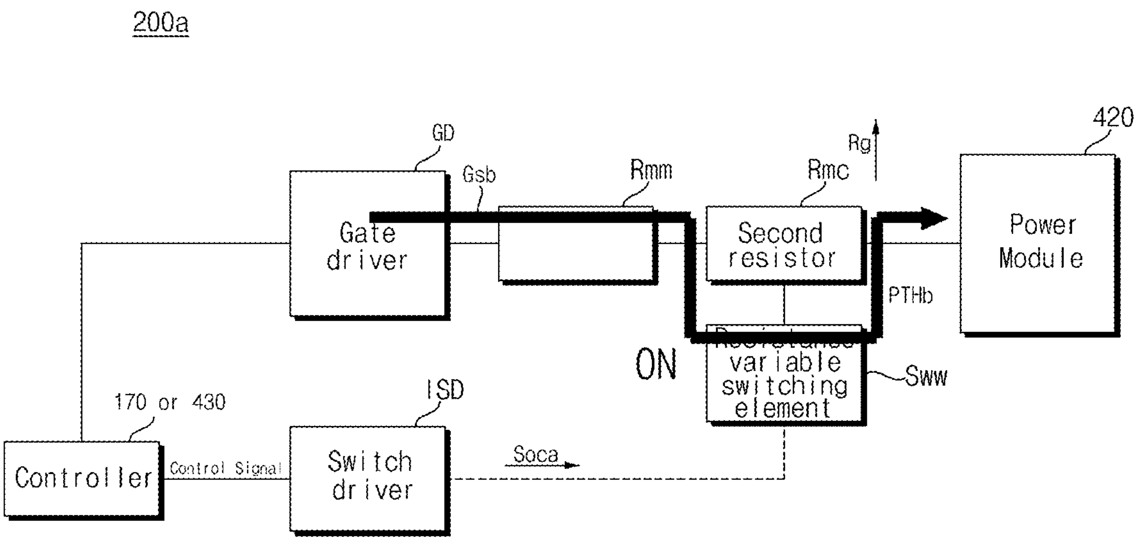

That is, the controller 170 or the inverter controller 430 turns on the resistance variable switching element Sww, as illustrated in FIG. 10B or FIG. 10D, in response to the voltage level of the dc terminal being in the second voltage range RGc.

Accordingly, a gate signal Gsv output from the first output terminal OUTH of the gate driver GD is applied to the upper inverter switching element Sa through the first resistor Rma.

Consequently, the switching voltage Vdsa rises to the peak voltage Vpkb which is less than the maximum allowable voltage Vsdma, according to the second rising slope SLb greater than the first rising slope SLa based on the first resistor Rma and the second resistor Rmc, and then falls to maintain the constant voltage Vsta. A voltage margin at this time may be MRy.

Due to the switching voltage Vdsb and the switching current Idb, a switching loss Lssab is generated, but unlike FIG. 7C, since the rising slope becomes greater, the switching loss is ultimately significantly reduced.

Accordingly, by changing the rising slope of the upper inverter switching element Sa, the switching loss of the inverter 420 may be reduced.

In particular, for the second voltage range RGc, which is a frequently occurring operating voltage range, the switching loss may be significantly reduced by increasing the rising slope.

FIG. 10A is a view illustrating a case where the resistance variable switching element Sww is turned off.

Referring to the drawing, when the resistance variable switching element Sww is turned off based on the first level of the switch control signal Soca, the gate control signal Gsa is input to the gate terminal of the upper inverter switching element Sa through the first resistor Rmm and the second resistor Rmc, which are a first path PTha.

That is, as the resistance variable switching element Sww is turned off, the upper inverter switching element Sa is turned on based on the first rising slope SLa.

FIG. 10B is a view illustrating a case where the resistance variable switching element Sww is turned on.

Referring to the drawing, when the resistance variable switching element Sww is turned on based on a second level of a switch control signal Socb, the gate control signal Gsb is input to the gate terminal of the upper inverter switching element Sa through the first resistor Rmm and the resistance variable switching element Sww, which are a second path PThb.

That is, as the resistance variable switching element Sww is turned on, the upper inverter switching element Sa is turned on based on the second rising slope SLb.

Accordingly, it is possible to change the rising slope of the upper inverter switching element Sa, and reduce the switching loss of the inverter 420.

FIG. 10C is a block diagram of the motor driving device **200*a* corresponding to FIG. 10*a*, and FIG. 10D is a block diagram of the motor driving device 200*a* corresponding to FIG. 10**B.

Figure 11A:
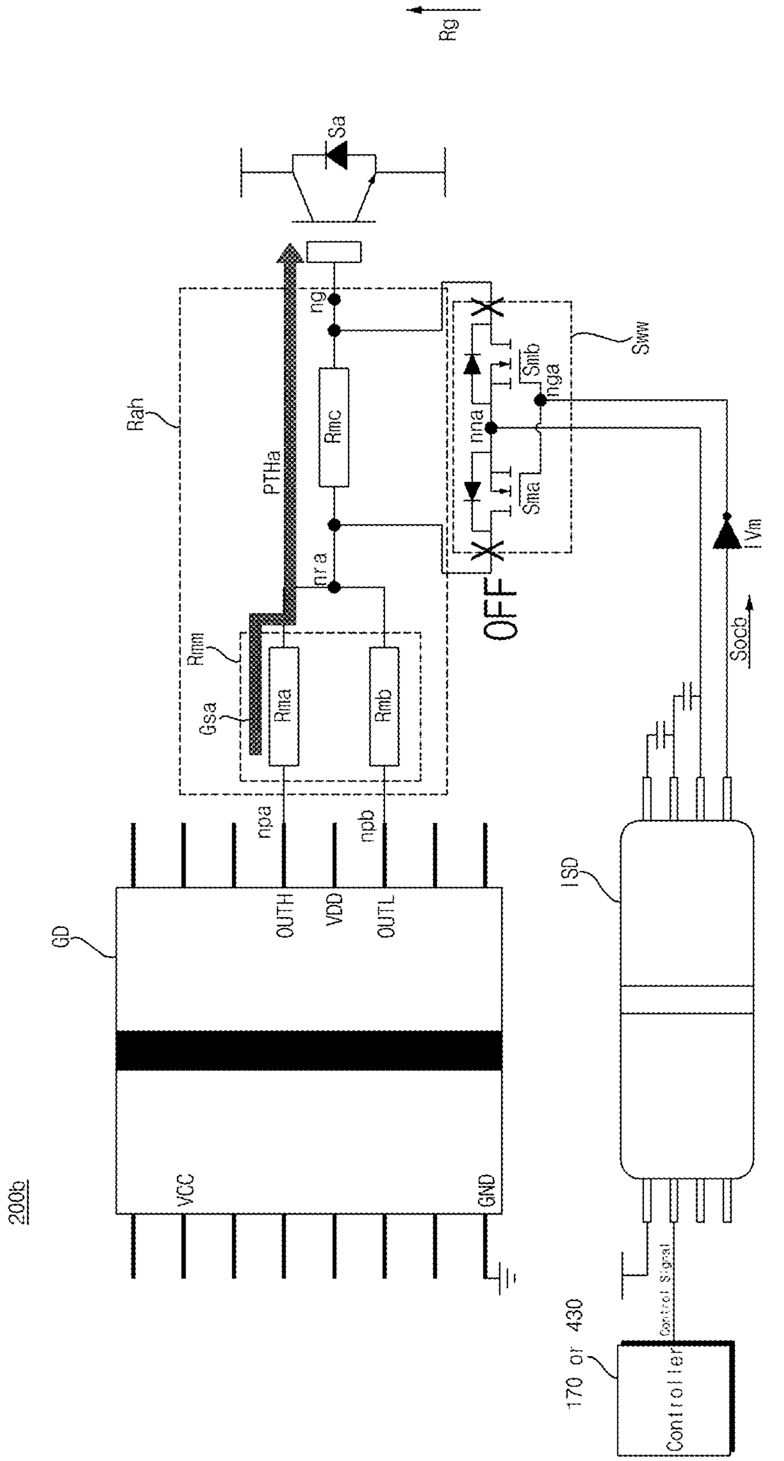
FIG. 11A is an example of a circuit diagram of a motor driving device according to another embodiment of the present disclosure.

FIG. 11A is an example of a circuit diagram of a motor driving device according to another embodiment of the present disclosure.

Referring to the drawing, a motor driving device **200*b* according to another embodiment of the present disclosure includes an inverter 420** including a plurality of inverter switching elements Sa to Sc and S'a to S'c, a gate driver GD which outputs a gate control signal to each of gate terminals of the plurality of inverter switching elements Sa to Sc and S'a to S'c, a first resistor Rmm and a second resistor Rmc which are arranged between the gate driver GD and the gate terminals of each of the inverter switching elements Sa to Sc and S'a to S'c, a resistance variable switching element Sww which is connected to both ends of the second resistor Rmc, a switch driver ISD which outputs a switch control signal to the resistance variable switching element Sww, and a inverter IBm disposed between the switch driver ISD and the resistance variable switching element Sww.

That is, the motor driving device **200*b* of FIG. 11A is different from the motor driving device 200*a* of FIG. 8 in that the motor driving device 200**B further includes the inverter IBm.

Meanwhile, FIG. 11A is a view illustrating a case where the resistance variable switching element Sww is turned off.

Referring to the drawing, when the resistance variable switching element Sww is turned off based on the second level of the switch control signal Socb, and the inverter IBm, the gate control signal Gsa is input to the gate terminal of the upper inverter switching element Sa through the first resistor Rmm and the second resistor Rmc, which are the first path PTha.

That is, as the resistance variable switching element Sww is turned off, the upper inverter switching element Sa is turned on based on the first rising slope SLa.

Figure 11B:
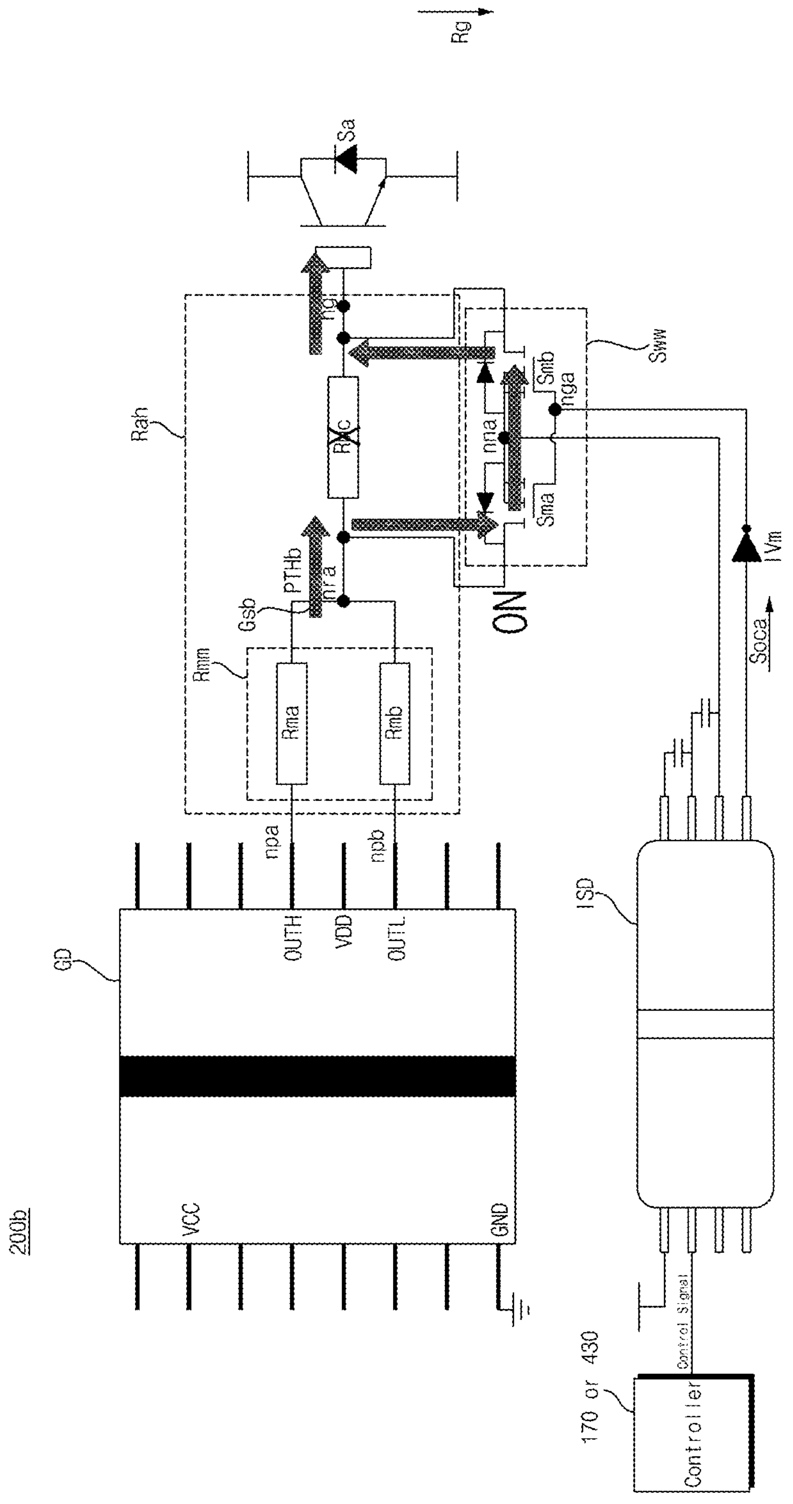
FIGS. 11B to 11D are views referred to in the description of FIG. 11A.
Figure 11C:
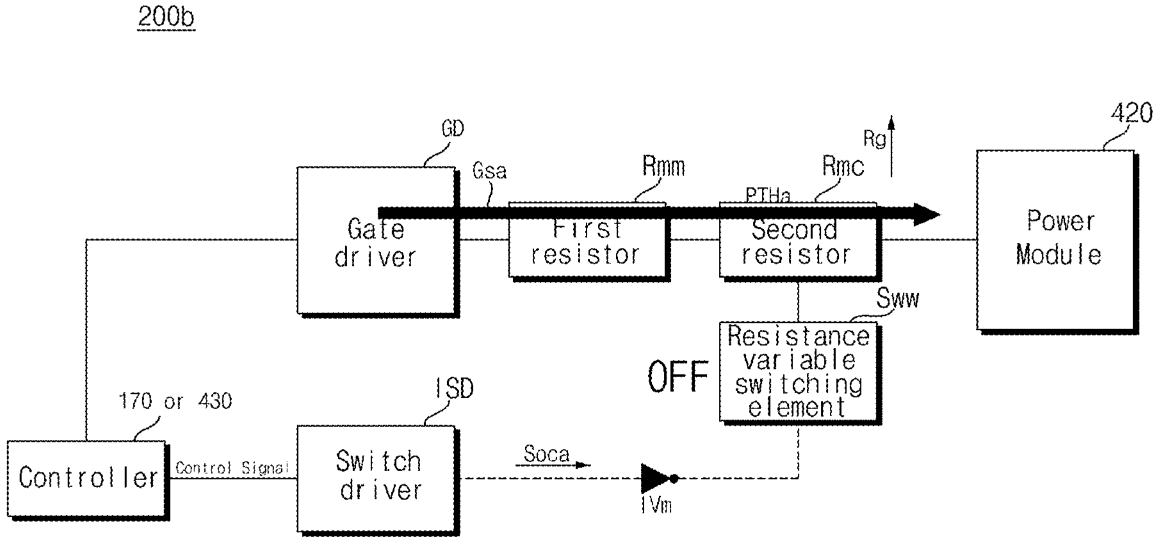
Figure 11D:
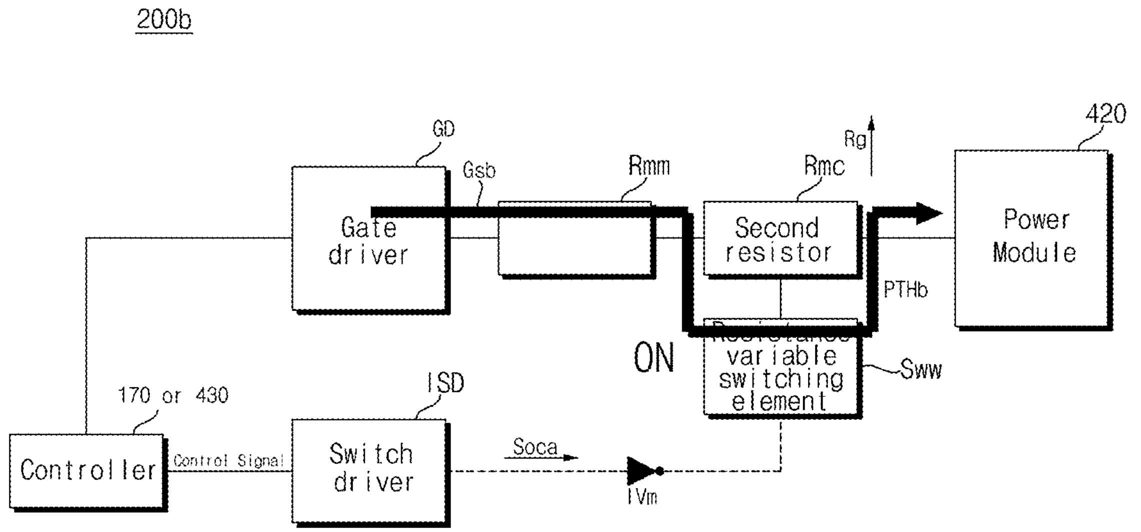

FIGS. 11B to 11D are views referred to in the description of FIG. 11A.

FIG. 11B is a view illustrating a case where the resistance variable switching element Sww is turned on.

Referring to the drawing, when the resistance variable switching element Sww is turned on based on the first level of the switch control signal Soca, and the inverter IBm, the gate control signal Gsb is input to the gate terminal of the upper inverter switching element Sa through the first resistor Rmm and the resistance variable switching element Sww, which are the second path PThb.

That is, as the resistance variable switching element Sww is turned on, the upper inverter switching element Sa is turned on based on the second rising slope SLb.

Accordingly, it is possible to change the rising slope of the upper inverter switching element Sa, and reduce the switching loss of the inverter 420.

FIG. 11C is a block diagram of the motor driving device 200*a* corresponding to FIG. 11*a*, and FIG. 11D is a block diagram of the motor driving device 200*a* corresponding to FIG. 11B.

Meanwhile, referring to FIGS. 8 to 11D, the inverter 420 in the motor driving device 8 includes three pairs of upper inverter switching elements Sa to Sc and lower inverter switching elements S'a to S'c that are connected in series with each other.

Accordingly, it is desirable to use three resistance variable switching elements Sww and three switch drivers ISD for three upper inverter switching elements Sa to Sc, respectively.

Meanwhile, it is desirable that three variable resistance switching elements Sww are used for three lower inverter switching elements S'a to S'c, respectively, and one switch driver ISD is used for common driving of three resistance variable switching elements Sww.

Accordingly, by using one switch driver ISD to output a common switching control signal, it is possible to efficiently drive the plurality of resistance variable switching elements Sww.

A motor driving device (200) according to another embodiment of the present disclosure includes an inverter 420 including a plurality of upper inverter switching elements Sa, a gate driver GD configured to output gate control signals to gate terminals of the plurality of upper inverter switching elements Sa, respectively, a voltage detector B configured to detect a voltage of a dc terminal corresponding to an input terminal of the inverter 420, and a controller 170 or an inverter controller 430 configured to control the inverter 420, and the controller 170 or the inverter controller 430 is configured to change the rising slope of the upper inverter switching elements Sa based on a voltage level of the dc terminal. Accordingly, the switching loss of the inverter 420 may be reduced.

Meanwhile, the controller 170 or the inverter controller 430 may be configured to turn on the upper inverter switching element Sa based on the first rising slope SLa in response to the voltage level of the dc terminal being the first voltage range RGd, and turn on control the upper inverter switching element Sa based on the second rising slope SLb greater than the first rising slope SLa in response to the voltage level of the dc terminal being the second voltage range RGc less than the first voltage range RGd. Accordingly, it is possible to change the rising slope of the upper inverter switching element Sa, and the switching loss of the inverter 420 may be reduced.

Meanwhile, the controller 170 or the inverter controller 430 may be configured to turn on the upper inverter switching element Sa based on a first rising slope SLa based on the turn-off of the resistance variable switching element Sww, and turn on the upper inverter switching element Sa based on a second rising slope SLb greater than the first rising slope SLa based on the turn-on of the resistance variable switching element Sww. Accordingly, it is possible to change the rising slope of the upper inverter switching element Sa, and reduce the switching loss of the inverter 420.

Meanwhile, the controller 170 or the inverter controller 430 may be configured to control a gate resistance of the upper inverter switching element Sa to be a first resistance value according to the turn-off of the resistance variable switching element Sww, and control the gate resistance of the upper inverter switching element Sa to be a second resistance value less than the first resistance value according to the turn-on of the resistance variable switching element Sww. Accordingly, it is possible to change the rising slope of the upper inverter switching element Sa, and reduce the switching loss of the inverter 420.

Figure 12A:
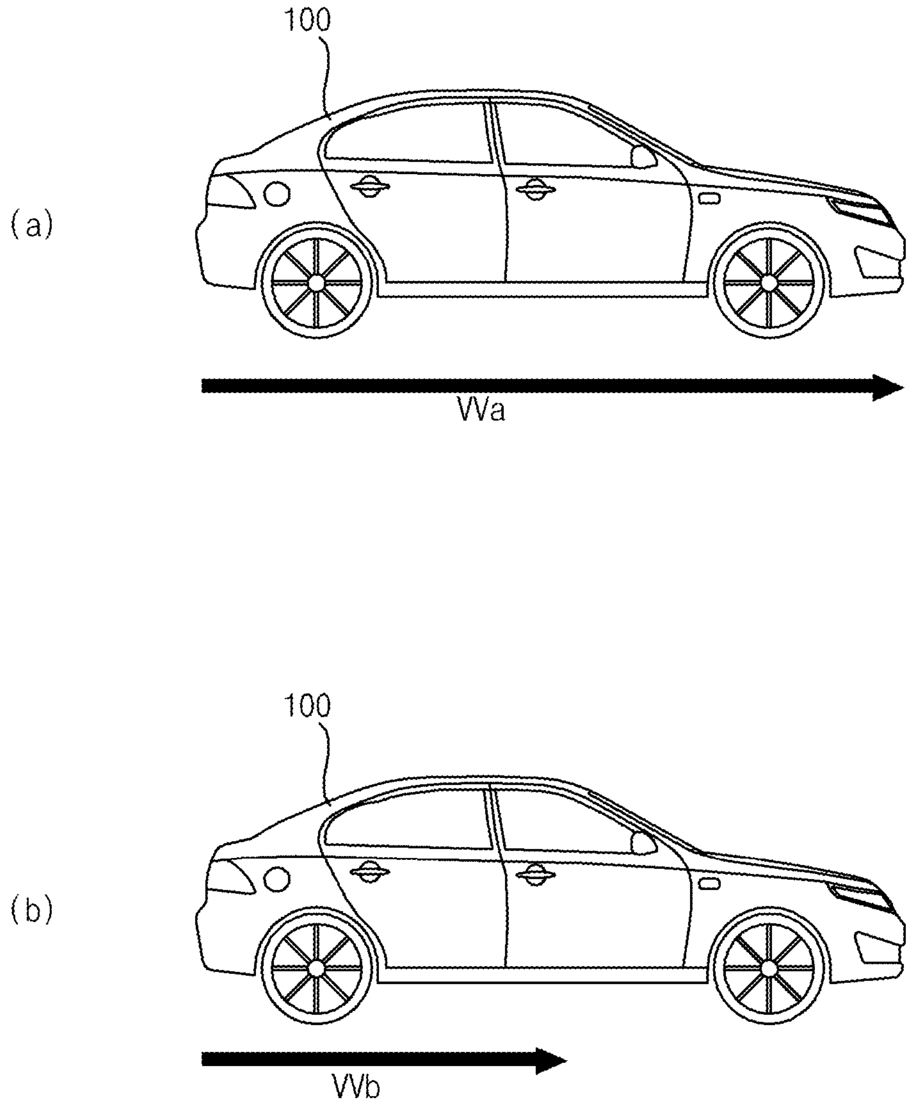
FIGS. 12A and 12B are views illustrating various operation states of a vehicle according to an embodiment of the present disclosure.
Figure 12B:
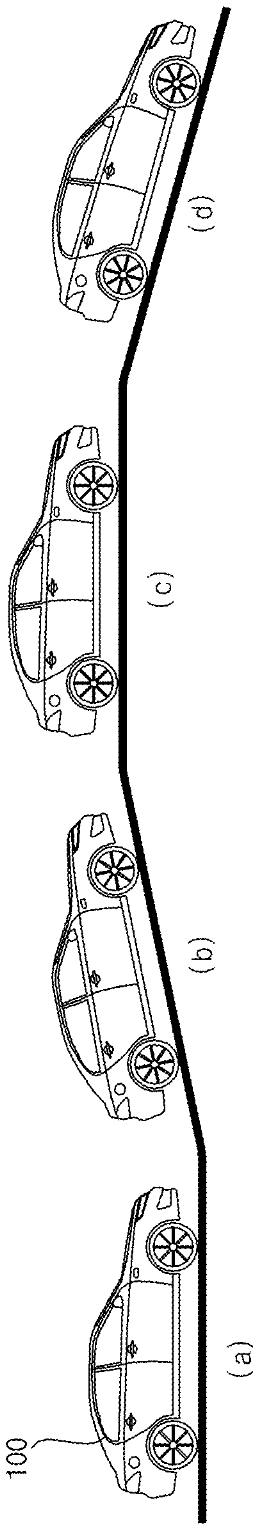

FIGS. 12A and 12B are views illustrating various operation states of a vehicle according to an embodiment of the present disclosure.

First, FIG. 12A illustrates that a velocity of the vehicle 100 is a first velocity VVa.

Referring to the drawing, the controller 170 or the inverter controller 430 may be configured to turn on the plurality of inverter switching elements Sa to S'c based on the first rising slope SLa when the velocity of the vehicle 100 is the first velocity VVa which is equal to or more than a reference velocity.

Next, FIG. 12B illustrates that the velocity of the vehicle 100 is a second velocity VVb less than the first velocity VVa.

Referring to the drawing, the controller 170 or the inverter controller 430 may be configured to turn on the plurality of inverter switching elements Sa to S'c based on the second rising slope SLb greater than the first rising slope SLa when the velocity of the vehicle 100 is the second velocity VVb which is less than the reference velocity. Accordingly, it is possible to change the rising slope of the plurality of upper inverter switching element Sa to S'c based on the velocity of the vehicle 100, and reduce the switching loss of the inverter 420.

FIG. 12B illustrates that the vehicle 100 is driven sequentially on a flatland, an uphill road, the flatland, and a downhill road.

Referring to the drawing, as illustrated in (d) of FIG. 12B, when the vehicle 100 is driven on the downhill road, the controller 170 or the inverter controller 430 may be configured to turn on the plurality of inverter switching elements Sa to S'c based on the first rising slope SLa.

Next, as illustrated in (b) of FIG. 12B, when the vehicle 100 is driven on the uphill road, the controller 170 or the inverter controller 430 may be configured to turn on the plurality of inverter switching elements Sato S'c based on the second rising slope SLb greater than the first rising slope SLa. Accordingly, by performing inverter switching based on the second rising slope SLb in an uphill road section with high power consumption, switching loss may be significantly reduced.

Consequently, it is possible to change the rising slopes of the plurality of upper inverter switching element Sa to S'c based on a driving path, and reduce the switching loss of the inverter 420.

While the embodiments of the present disclosure have been illustrated and described above, the present disclosure is not limited to the aforementioned specific embodiments, various modifications may be made by a person with ordinary skill in the technical field to which the present disclosure pertains without departing from the subject matters of the present disclosure that are claimed in the claims, and these modifications should not be appreciated individually from the technical spirit or prospect of the present disclosure.

What is claimed is:

1. A motor driving device comprising:

an inverter including a plurality of inverter switching elements;

a gate driver configured to output agate control signal to agate terminal of the plurality of inverter switching elements, respectively;

a first resistor and a second resistor arranged between the gate driver and the gate terminal of each inverter switching element;

a resistance variable switching element connected to both ends of the second resistor;

a switch driver configured to output a switch control signal to the resistance variable switching element;

a voltage detector configured to detect a voltage of a dc terminal corresponding to an input terminal of the inverter; and a controller configured to control the switch driver, wherein the controller is configured to:

turn on an inverter switching element of the plurality of inverter switching elements based on a first rising slope in response to a voltage level of the dc terminal being in a first voltage range, and turn on the inverter switching element based on a second rising slope being greater than the first rising slope in response to the voltage level of the dc terminal being in a second voltage range less than the first voltage range.

2. The motor driving device of claim 1, wherein in response to the resistance variable switching element being turned off based on a first level of the switch control signal, the gate control signal is input to the gate terminal through the first resistor and the second resistor, and in response to the resistance variable switching element being turned on based on a second level of the switch control signal, the gate control signal is input to the gate terminal through the first resistor and the resistance variable switching element.

3. The motor driving device of claim 1, wherein the controller is configured to:

turn on the inverter switching element based on the first rising slope as the resistance variable switching element is turned off, and turn on the inverter switching element based on the second rising slope being greater than the first rising slope as the resistance variable switching element is turned on.

4. The motor driving device of claim 1, wherein the controller is configured to:

control a gate resistance of the inverter switching element to be a first resistance value as the resistance variable switching element is turned off, and control the gate resistance of the inverter switching element to be a second resistance value less than the first resistance value as the resistance variable switching element is turned on.

5. The motor driving device of claim 1, wherein a resistance value of the second resistor is greater than a resistance value of the first resistor.

6. The motor driving device of claim 1, wherein a gate-on resistance of the gate terminal is greater than a gate-off resistance.

7. The motor driving device of claim 1, wherein a rising time when the gate terminal is turned on is greater than a falling time when the gate terminal is turned on.

8. The motor driving device of claim 1, wherein the inverter includes three pairs of upper inverter switching elements and lower inverter switching elements connected to each other in series, and the switch driver is configured to output a common switch control signal to a resistance variable switching element connected to each of three lower inverter switching elements.

9. A motor driving device comprising:

an inverter including a plurality of inverter switching elements;

a gate driver configured to output agate control signal to gate terminal of the plurality of inverter switching elements, respectively;

a voltage detector configured to detect a voltage of a dc terminal corresponding to an input terminal of the inverter; and a controller configured to control the inverter, wherein the controller is configured to change a rising slope of an inverter switching element of the plurality of inverter switching elements based on a voltage level of the dc terminal, wherein the controller is configured to:

turn on the inverter switching element based on a first rising slope in response to the voltage level of the de terminal being in a first voltage range, and turn on the inverter switching element based on a second rising slope being greater than the first rising slope in response to the voltage level of the de terminal being in a second voltage range less than the first voltage range.

10. The motor driving device of claim 9, further comprising:

a first resistor and a second resistor arranged between the gate driver and the gate terminal of each inverter switching element;

a resistance variable switching element connected to both ends of the second resistor; and a switch driver configured to output a switch control signal to the resistance variable switching element.

11. The motor driving device of claim 10, wherein the controller is configured to:

turn on the inverter switching element based on the first rising slope as the resistance variable switching element is turned off, and turn on the inverter switching element based on the second rising slope being greater than the first rising slope as the resistance variable switching element is turned on.

12. The motor driving device of claim 10, wherein the controller is configured to:

control a gate resistance of the inverter switching element to be a first resistance value as the resistance variable switching element is turned off, and control the gate resistance of the inverter switching element to be a second resistance value less than the first resistance value as the resistance variable switching element is turned on.

13. A vehicle comprising:

a motor driving device including:

an inverter including a plurality of inverter switching elements;

a gate driver configured to output a gate control signal to a gate terminal of the plurality of inverter switching elements, respectively;

a first resistor and a second resistor arranged between the gate driver and the gate terminal of each inverter switching element;

a resistance variable switching element connected to both ends of the second resistor;

a switch driver configured to output a switch control signal to the resistance variable switching element;

a voltage detector configured to detect a voltage of a dc terminal corresponding to an input terminal of the inverter; and a controller configured to control the switch driver, wherein the controller is configured to:

turn on the inverter switching element based on a first rising slope in response to a voltage level of the dc terminal being in a first voltage range, and turn on the inverter switching element based on a second rising slope being greater than the first rising slope in response to the voltage level of the dc terminal being in a second voltage range less than the first voltage range.

14. The vehicle of claim 13, wherein the controller is configured to:

control the switch driver, turn on the inverter switching element based on the first rising slope when a vehicle velocity is equal to or more than a reference velocity, and turn on the inverter switching element based on the second rising slope being greater than the first rising slope when the vehicle velocity is less than the reference velocity.

15. The vehicle of claim 13, wherein the controller is configured to:

turn on the inverter switching element based on the first rising slope in response to the vehicle being driven on a downhill road, and turn on the inverter switching element based on the second rising slope being greater than the first rising slope in response to the vehicle being driven on an uphill road.

16. The vehicle of claim 13, wherein in response to the resistance variable switching element being turned off based on a first level of the switch control signal, the gate control signal is input to the gate terminal through the first resistor and the second resistor, and in response to the resistance variable switching element being turned on based on a second level of the switch control signal, the gate control signal is input to the gate terminal through the first resistor and the resistance variable switching element.

17. The vehicle of claim 13, wherein the controller is configured to:

turn on the inverter switching element based on the first rising slope as the resistance variable switching element is turned off, and turn on the inverter switching element based on the second rising slope being greater than the first rising slope as the resistance variable switching element is turned on.

18. The vehicle of claim 13, wherein the controller is configured to:

control a gate resistance of the inverter switching element to be a first resistance value as the resistance variable switching element is turned off, and control the gate resistance of the inverter switching element to be a second resistance value less than the first resistance value as the resistance variable switching element is turned on.

* * * * *